United States Patent
Trezza et al.

(10) Patent No.: US 7,289,547 B2
(45) Date of Patent: Oct. 30, 2007

(54) LASER AND DETECTOR DEVICE

(75) Inventors: John Trezza, Nashua, NH (US); Mohamed Diagne, Nashua, NH (US)

(73) Assignee: Cubic Wafer, Inc., Merrimack, NH (US)

( * ) Notice: Subject to any disclaimer, the term of this patent is extended or adjusted under 35 U.S.C. 154(b) by 34 days.

(21) Appl. No.: 10/697,815

(22) Filed: Oct. 29, 2003

(65) Prior Publication Data
US 2005/0094695 A1    May 5, 2005

(51) Int. Cl.
*H01S 5/00* (2006.01)
(52) U.S. Cl. .................................. 372/50.21; 372/50.1
(58) Field of Classification Search .............. 372/50.1, 372/50.21
See application file for complete search history.

(56) References Cited

U.S. PATENT DOCUMENTS

| | | | | |
|---|---|---|---|---|
| 4,719,498 A | * | 1/1988 | Wada et al. | 257/292 |
| 5,136,152 A | * | 8/1992 | Lee | 257/699 |
| 5,475,701 A | * | 12/1995 | Hibbs-Brenner | 372/50.124 |
| 5,491,712 A | * | 2/1996 | Lin et al. | 372/50.21 |
| 5,577,064 A | * | 11/1996 | Swirhun et al. | 372/96 |
| 5,674,778 A | * | 10/1997 | Lee et al. | 438/24 |
| 5,751,757 A | * | 5/1998 | Jiang et al. | 372/50.21 |
| 5,914,976 A | * | 6/1999 | Jayaraman et al. | 372/50.21 |
| 5,978,401 A | * | 11/1999 | Morgan | 372/50.21 |
| 6,084,848 A | * | 7/2000 | Goto | 369/121 |
| 6,479,844 B2 | * | 11/2002 | Taylor | 257/192 |
| 6,483,862 B1 | * | 11/2002 | Aronson et al. | 372/50.21 |
| 6,888,170 B2 | * | 5/2005 | Schaff et al. | 257/98 |
| 2003/0002555 A1 | * | 1/2003 | Tran et al. | 372/50 |

OTHER PUBLICATIONS

International Search Report for PCT/US04/34603, dated Oct. 6, 2006.

* cited by examiner

*Primary Examiner*—MinSun Oh Harvey
*Assistant Examiner*—Phillip Nguyen
(74) *Attorney, Agent, or Firm*—Morgan & Finnegan LLP

(57) ABSTRACT

A detector is disposed on the passive side of a laser to detect photon leakage through the passive side mirror and measure as current created in the detector via a Schottky contact.

18 Claims, 25 Drawing Sheets

US 7,289,547 B2

LASER AND DETECTOR DEVICE

FIELD OF THE INVENTION

This invention relates to optical devices and, more particularly to lasers and photodetectors.

BACKGROUND OF THE INVENTION

Typical lasers are comprised of two mirrors and an active region cavity. In Vertical Cavity Surface Emitting Lasers (VCSELS), there are two mirrors, a bottom mirror (which is larger/more reflective) and a top mirror, through which the light is output. In addition there is an active region, in between the two, where the light is generated. The mirrors are typically "doped", which means that impurities are inserted into the material to make them electrically conductive. The active region is typically "intrinsic", meaning that it is not doped with the impurities to get significant conductivity.

Electrically pumped lasers take electrical input current and convert it to light power output. How much light a laser emits as a function of how much current is input depends upon several parameters. First is the details of the laser structure. A laser structure can either be optimized for high output power, but then it requires high input current, or it can be optimized for low current operation, but then it will not put out as much light.

There are three other main parameters related to laser operation: the threshold current, the differential quantum efficiency, and the maximum output power point. As shown in FIG. 1, which is an example characteristic curve 100 for a laser, the threshold current 102 is the minimum current at which a laser begins to "lase". Below the threshold current 104, the device acts as a light emitting diode (LED). The differential quantum efficiency 106 is the change in output power per unit change in input current. The maximum output power point 108 is the maximum power the laser can output and is related to the input current required to reach that power output.

Other non-structural conditions that affect laser operation are: 1) the temperature of the laser, 2) the natural aging of the laser, and 3) degradation of the laser due to environmental, mechanical or electrical shocks.

Every semiconductor laser has an operational characteristic curve that describes the relationship between the input current and the laser's output power. One such representative curve is shown in FIG. 2. As shown in FIG. 2, when operating a laser, one typically sets two currents, the current corresponding to the "off" or '0' logic state ($I_{bias}$) and the current corresponding to the "on" or '1' logic state ($I_{bias}$+$I_{mod}$), where $I_{bias}$ is the bias current and $I_{mod}$ is the modulation current. When any one or more of the non-structural conditions change, the relationship between the output power and input current characteristic of the laser changes. This typically results in a "flattening" of the laser characteristic curve, referred to as being in a "degraded" state.

FIG. 3 is a copy of the curve of FIG. 2 juxtaposed with an example curve for the same device in a degraded state. As shown in FIG. 3, the degraded state results in the $I_{bias}$ level being in the region where the laser is merely an LED. As a result, as shown in FIG. 3, the settings for $I_{bias}$ and/or $I_{mod}$ must be changed to achieve the same or an acceptable output power performance.

Of course, over time in some cases, the laser will become so severely degraded such that even if both the bias and modulation current are changed and the original (or at least minimum required) output power still can not be reached. At that point, the laser can be said to be effectively, if not actually, dead.

To account for laser degradation and adapt to non-structural changes, typically the laser output is measured so the $I_{bias}$ and/or $I_{mod}$ settings can regularly be adjusted to account for any such changes. In order to do so, designers try to sample the laser output power accurately, and in real time, to continually identify when a change to the $I_{bias}$ and/or $I_{mod}$ settings must be made and adjust for it in a process analogous to feedback compensation in an electrical circuit.

One way this has been done for transmitter assemblies is shown in FIG. 4. A discrete detector 402 is incorporated into a package 404 that contains at least one laser 406. The package 404 includes connections, shown here as pins 408, that provide power, ground and external signal access to the laser(s) 406 and detector 402. The package 404 housing the laser(s) 406 and detector 402 has a semi-transparent window 412 located above the laser(s) 406 and detector 402 and spaced from them at a sufficient distance so that some of the light emitted by the laser(s) 406 will be reflected back to the detector 402. The detector 402 is used to sample the output light and, based upon the amount of light detected, help identify when the $I_{bias}$ and/or $I_{mod}$ settings should be adjusted and/or when they can no longer be adjusted so that the laser is considered degraded beyond usability or "dead".

While the above arrangement works, its use is typically limited to instances where there the number of lasers common to a detector is small (since the detector will be sampling an aggregate and can not discriminate among the different lasers), ideally with there being one detector per laser (and the pair being isolated from any other laser-detector pairs). The technique is not feasible however once the number of lasers increases to even a dozen or more. This is because, using the technique, the increased number of devices means added size, increased space requirements, more complexity, more connections, increased power requirements, reduced mean time between failures (MTBF) based upon an increased number of devices, etc.

Another approach is to use an intracavity photodetector. This approach is undesirable because the design of the intracavity photodetector must be part of the overall laser design, adding complexity and increasing cost.

An alternative approach is to place a detector structure, for example, a thin or semi-transparent Schottky contact (if a Schottky diode is used) or a grating (if a metal-semiconductor-metal (MSM) detector device is used) near the output of the laser so that light exiting the output of the laser (i.e. exiting through the mirror of the laser structure having the lower reflectivity relative to the other mirror) will pass by and through the detector structure as it exits the laser.

FIG. 5 illustrates, in simple fashion, a top emitting vertical cavity surface emitting laser (VCSEL) 500 using Schottky contact near the output of the laser.

The laser 500 has a top mirror 502, an active region 504, and a bottom mirror 506, with the bottom mirror 506 abutting the device substrate 508. Since this VCSEL is top emitting, light output 510 is through the top mirror 502. A Schottky contact 512, placed on the emission surface 514 of the laser 500, provides a current output proportional to the laser 500 output.

FIG. 6 illustrates, in simple fashion, a bottom emitting VCSEL 600 also using a Schottky contact near the output of the laser.

The laser 600 has a top mirror 602, an active region 604, and a bottom mirror 606, with the bottom mirror 606 abutting the device substrate 608. Since this VCSEL is bottom emitting, light output 510 is through the substrate 608. A Schottky contact 612 placed on the emission surface 614 of the laser 600 (also the surface of the substrate 608 opposite the surface on which laser mirrors 602, 606 and active region 604 reside) provides an output current proportional to the laser 600 output.

FIG. 7 illustrates, in simple fashion, a top emitting VCSEL 700 using a grating near the output of the laser.

The approach of FIG. 7 is identical to that of FIG. 5 except, instead of using a Schottky contact, a grating 702 and thin or semi-transparent MSM contact 704 are used.

FIG. 8 illustrates, in simple fashion, a bottom emitting VCSEL 800 using a grating near the output of the laser.

The approach of FIG. 8 is identical to that of FIG. 6 except, instead of using a Schottky contact, a grating 802 and thin or semi-transparent MSM contact 804 are used.

The approaches of FIG. 5 through FIG. 8, are easier to implement than an intracavity approach and provide an accurate reading of the laser output. However, each will also detrimentally affect the amount of exiting light as well as the mode quality.

There is no present way to accomplish the task of identifying when a laser output has degraded beyond a specified threshold or even that a laser is effectively dead with a semiconductor device incorporating an existing or established semiconductor laser design that does not impede or otherwise detrimentally affect the laser output.

SUMMARY OF THE INVENTION

We have devised a way to integrate a detector function with a device so as to not require a separate laser and detector arrangement, can be used. Our approach is usable with existing semiconductor lasers (including those purchased from third parties), it does not degrade the output of the laser, nor does it affect the mode of the output beam.

In overview, we integrate a power monitoring structure with a laser structure on the non-emission side of the laser. This monitoring structure monitoring of the laser over time in order to provide feedback regarding laser operation to, for example, maintain constant power output and/or accurately detect when an individual laser output has reduced to a point that compensation is required, that the laser has failed or degraded to the point of being effectively "dead" with respect to the application it is being used for.

Performing the sampling via a structure located on the non-emission side of the laser provides advantages, for example, one or more of the following: it is easily usable with both lasers of the top emitting (away from the laser substrate) and bottom emitting (toward the laser substrate) type, there is little to no feedback from outside the laser itself, the structure does not interfere with the laser output, the basic structural design for the laser can stay essentially, if not actually, the same, it allows for close integration/hybridization of the lasers with chips containing other electronic integrated circuits, and is compatible with very dense integration of the laser devices.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

Laser structures are very sensitive to their design and fabrication, and the laser designs presently in use have been optimized over many years to get adequate functionality. Thus, people seeking to use those lasers are reluctant to deviate from or alter those designs for fear of creating devices that do not work properly. Moreover, we have realized that such devices can be used without employing a structure that can interfere with the laser's output.

For ease of explanation herein, the side of the laser having the mirror with the lower reflectivity, which corresponds to the mirror through which the laser is intended to emit during operation is referred to as the "active" side. The side opposite the emission (i.e. active) side of the laser is referred to herein as the "passive side" of the laser and the mirror on that side is referred to as the passive side mirror.

Figure 1:
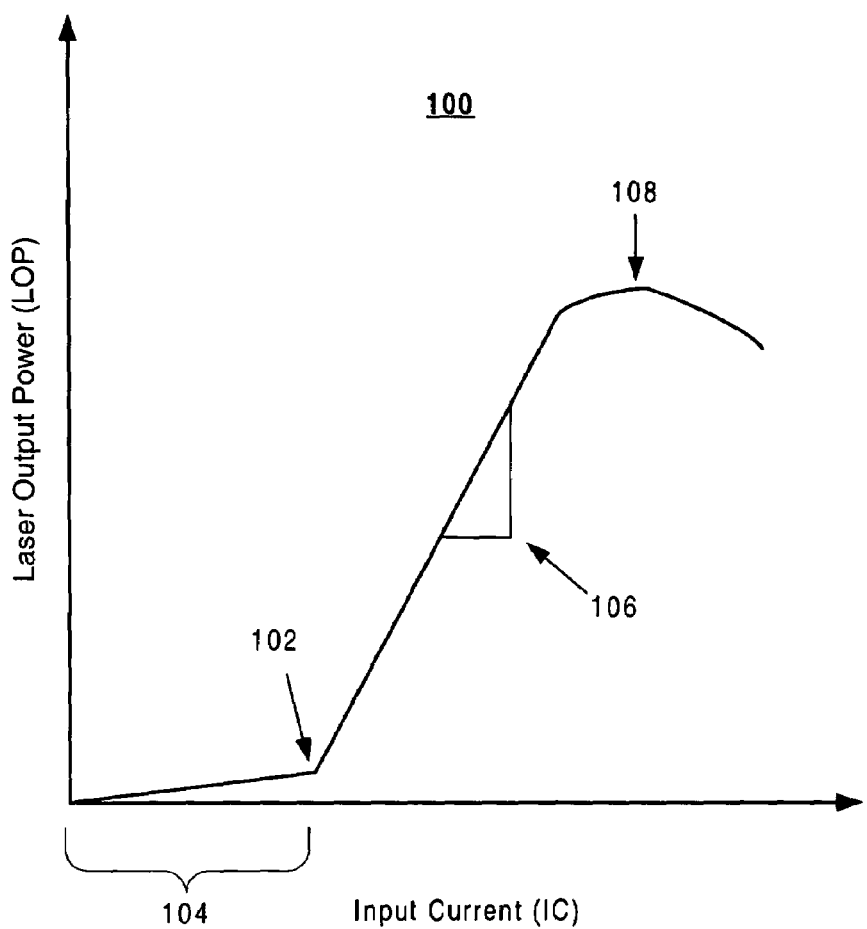
FIG. 1 is an example of a general characteristic curve for a laser.
Figure 2:
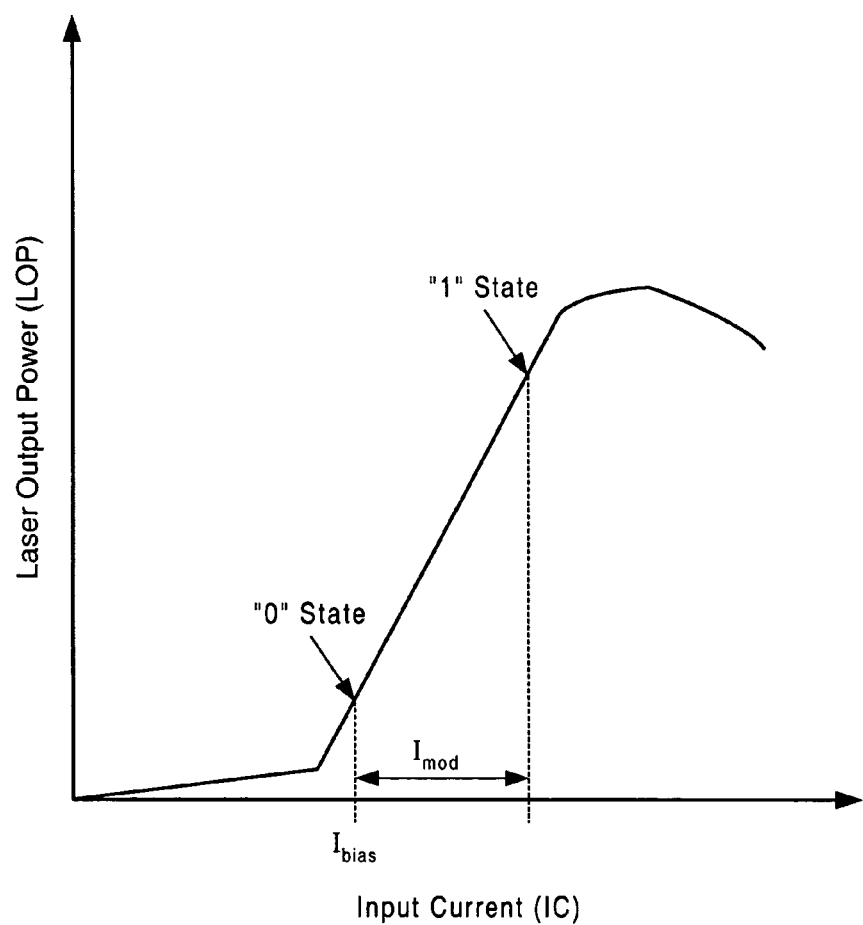
FIG. 2 is an example of a characteristic curve for a particular laser.
Figure 3:
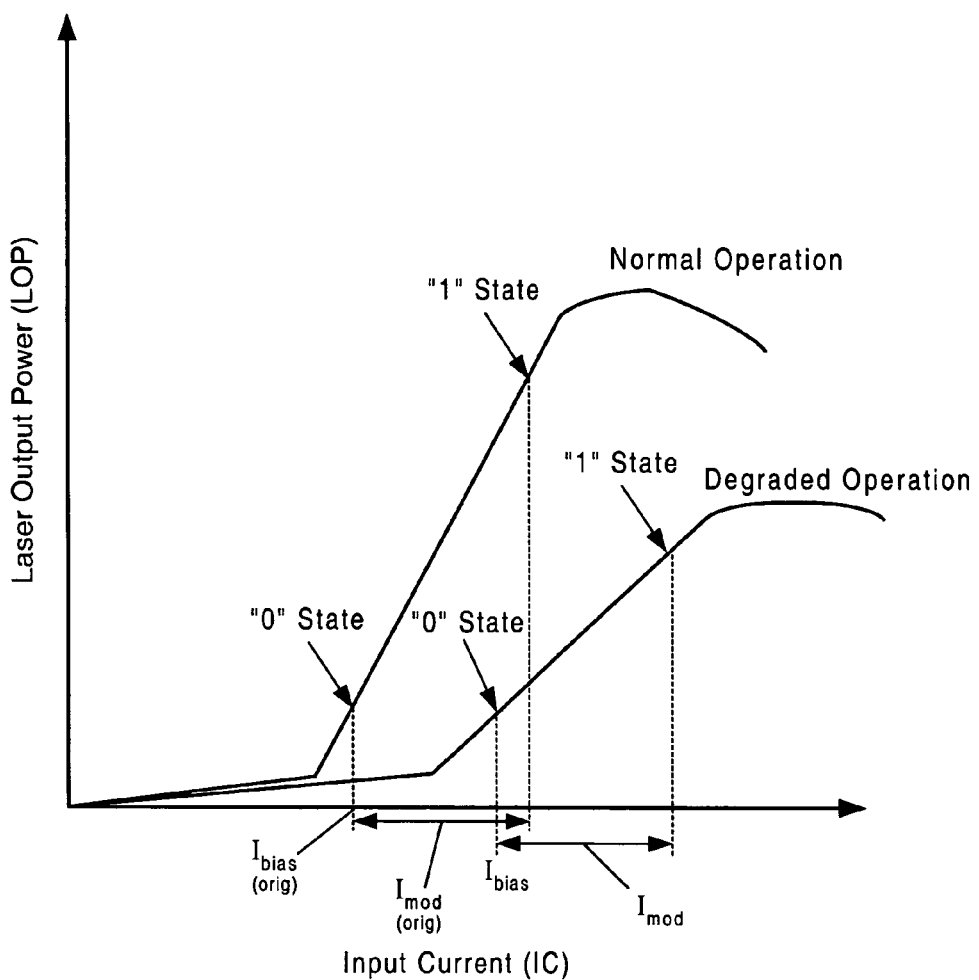
FIG. 3 is an example of a characteristic curve for the laser of FIG. 2 in normal and degraded states.
Figure 4:
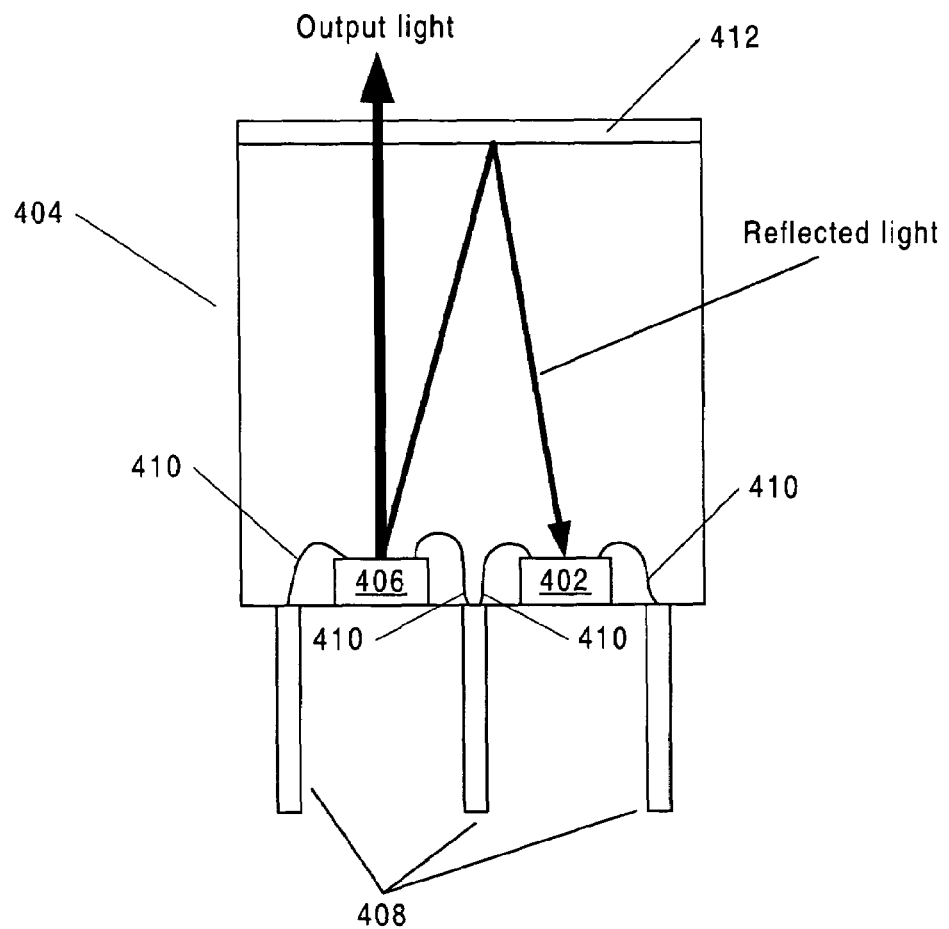
FIG. 4 is an example package of the prior art incorporating at least one laser and a detector.
Figure 5:
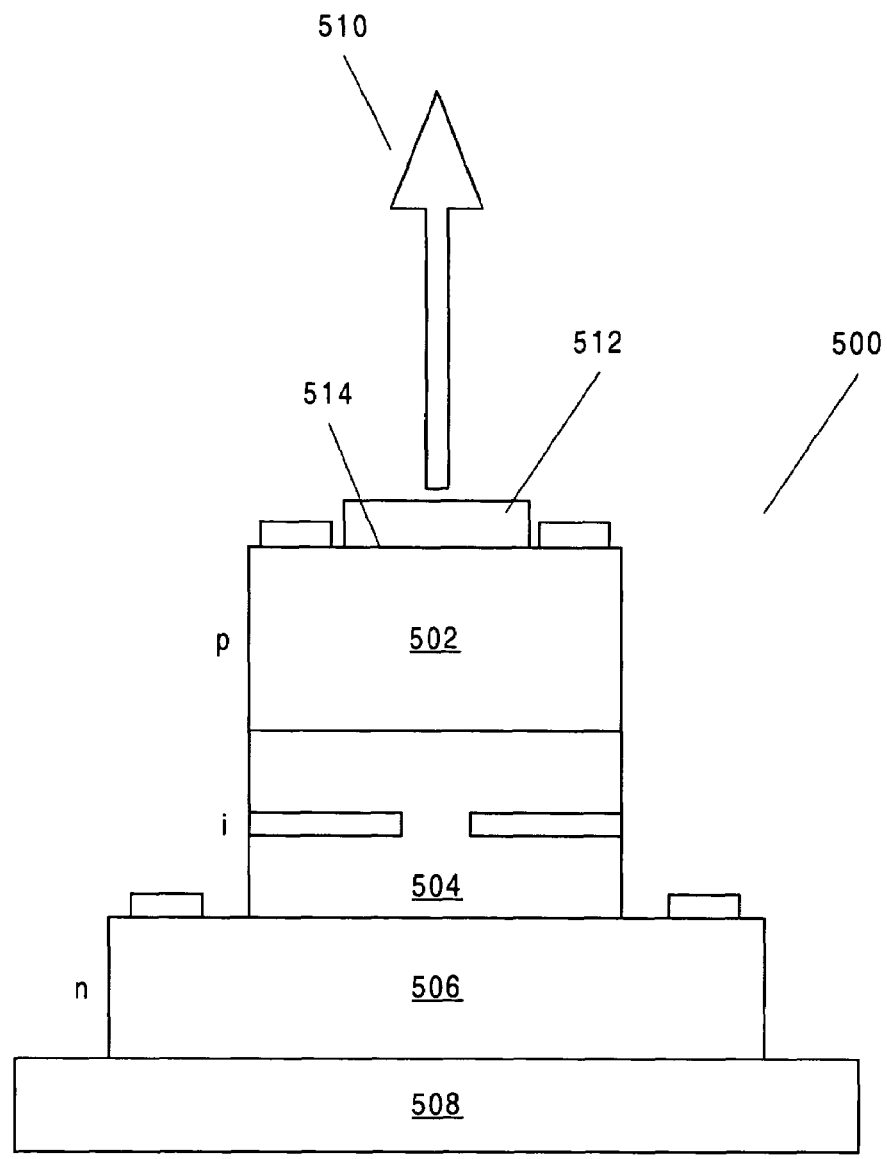
FIG. 5 illustrates, in simple fashion, a top emitting vertical cavity surface emitting laser (VCSEL) using Schottky contact near the output of the laser.
Figure 6:
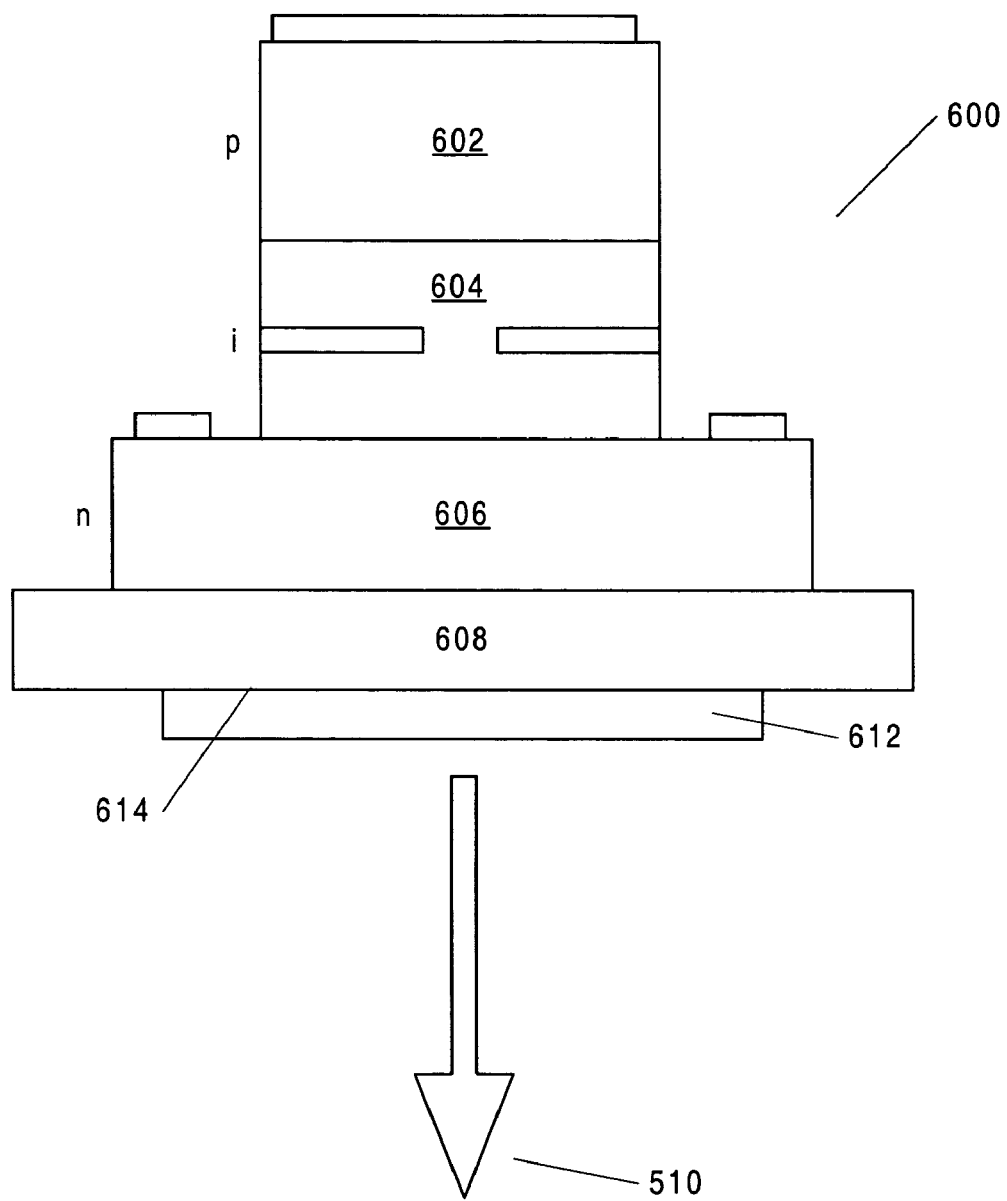
FIG. 6 illustrates, in simple fashion, a bottom emitting VCSEL also using a Schottky contact near the output of the laser.
Figure 7:
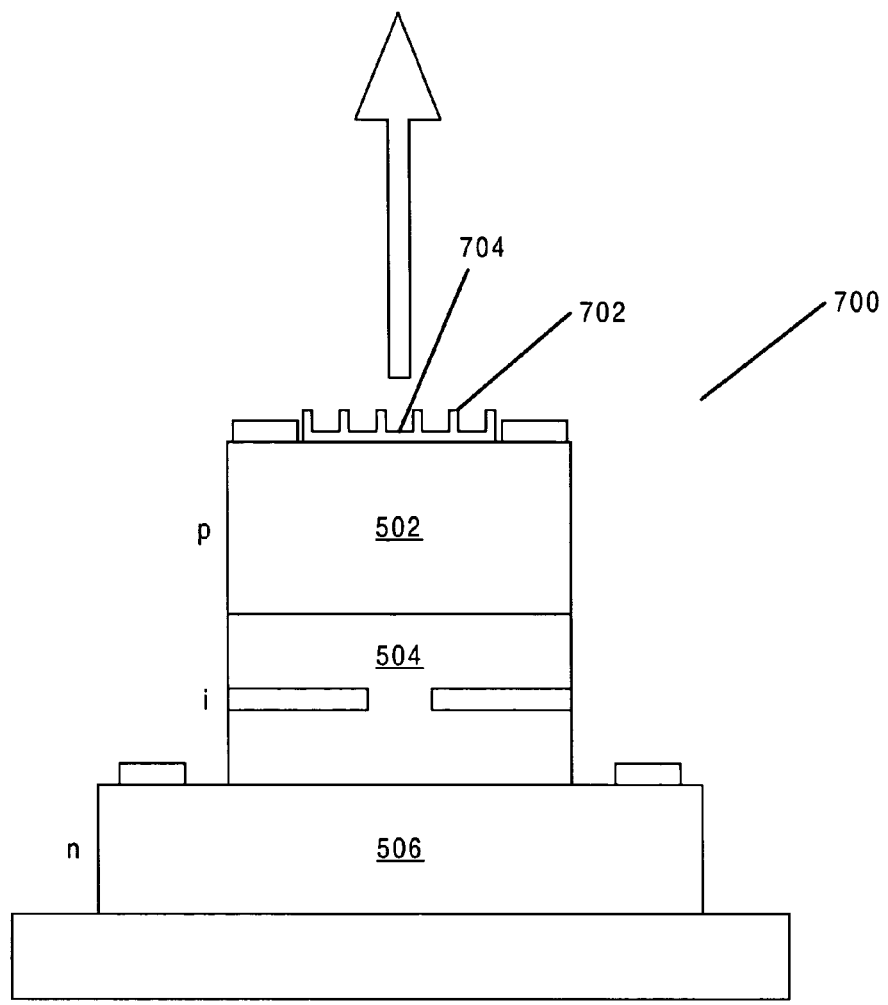
FIG. 7 illustrates, in simple fashion, a top emitting VCSEL using a grating near the output of the laser.
Figure 8:
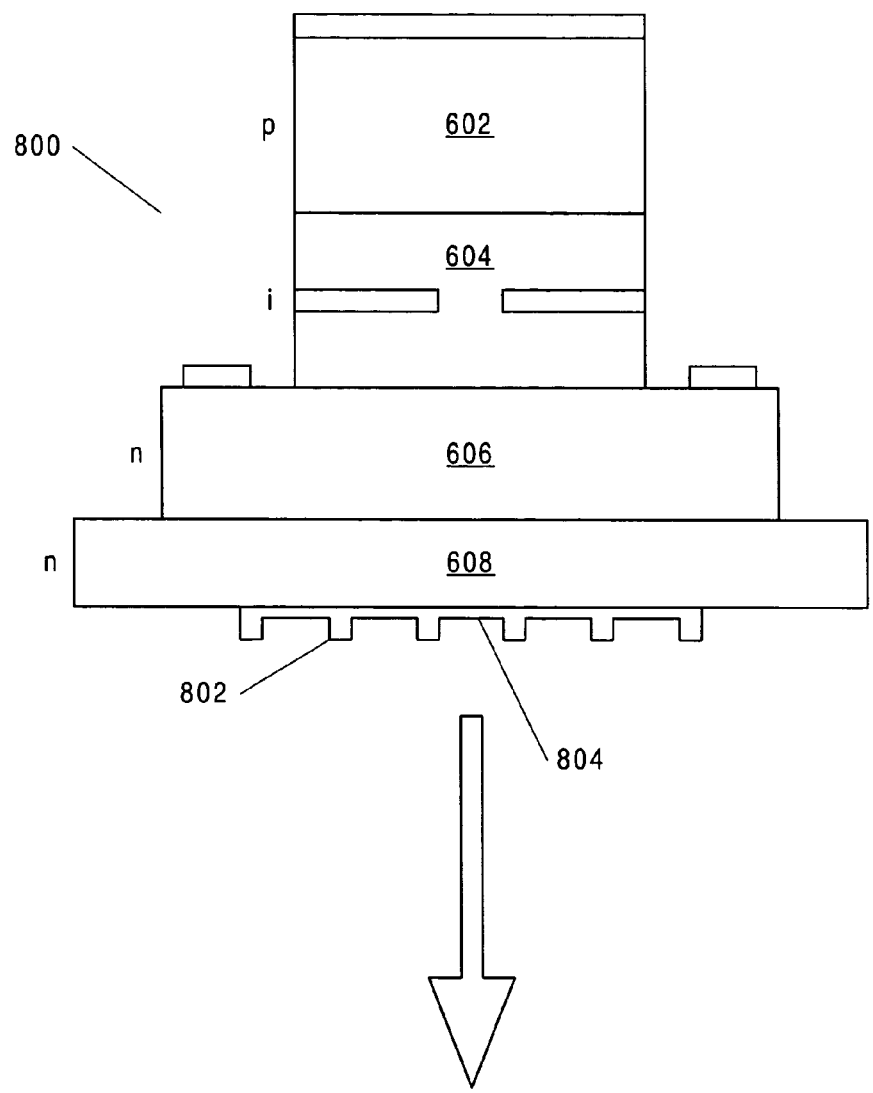
FIG. 8 illustrates, in simple fashion, a bottom emitting VCSEL using a grating near the output of the laser.
Figure 9:
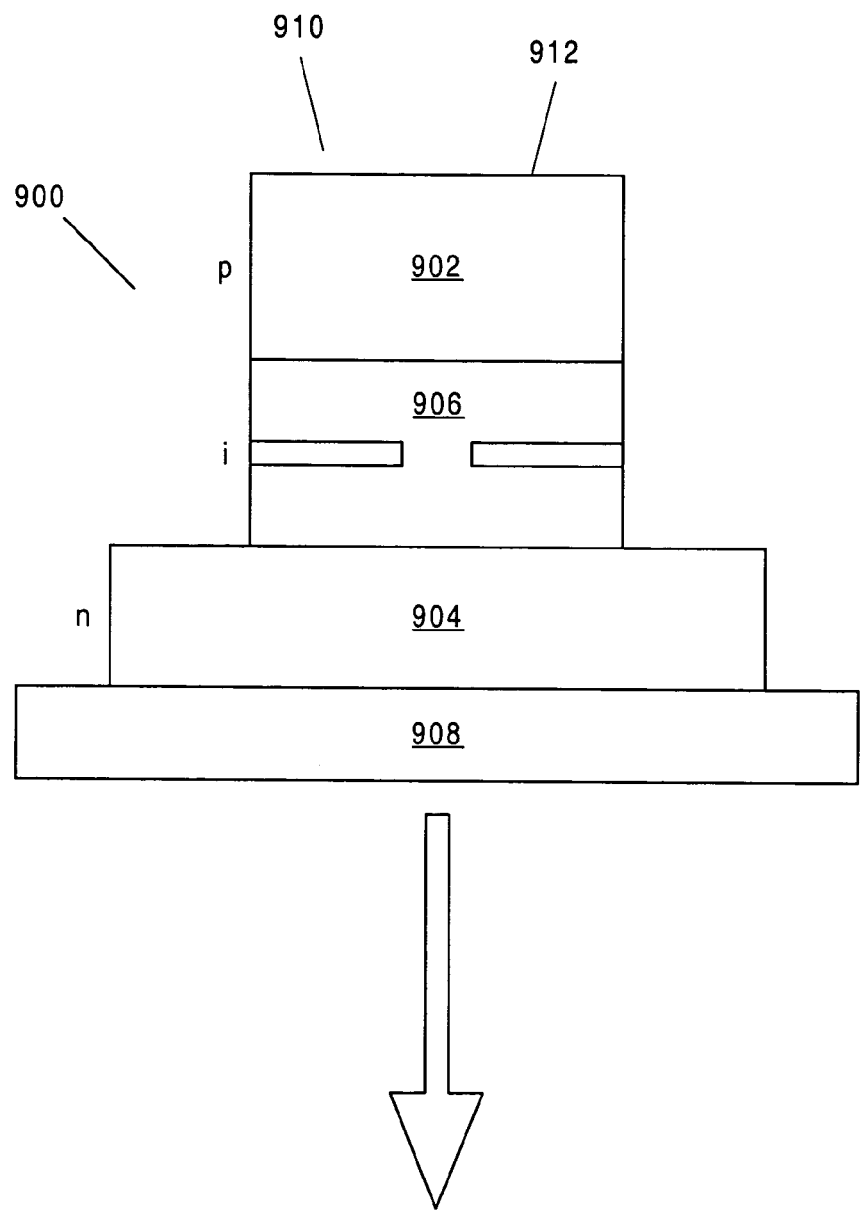
FIG. 9 is a simple representation of a conventional bottom emitting VCSEL.

FIG. 9 is a simple representation of a conventional bottom emitting VCSEL 900 comprising a pair of mirrors 902, 904, an active region 906 between the two mirrors 902, 904, and a substrate 908 on which the laser has been formed. Since this is a bottom emitting VCSEL, emission occurs through the substrate 908. As a result, the passive side 910 corresponds to the outer surface 912 of the upper mirror 902.

Figure 10:
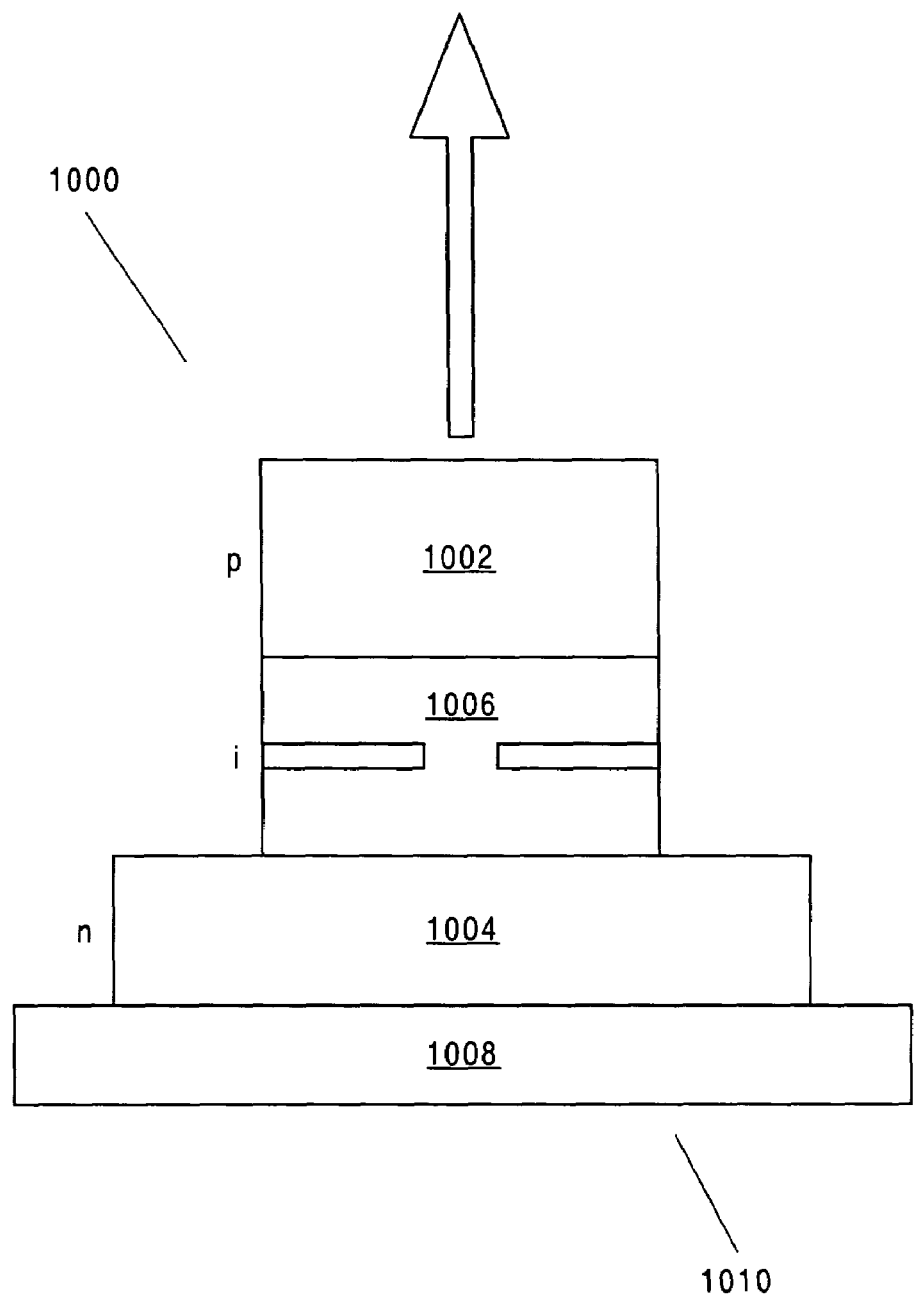
FIG. 10 is an example flowchart for a control algorithm for the operation of a system having one or more opto-electronic chips according to the present invention.

FIG. 10 is a simple representation of a conventional top emitting VCSEL 1000 comprising a pair of mirrors 1002, 1004, an active region 1006 between the two mirrors 1002, 1004, and a substrate 1008 on which the laser has been formed. Since this is a top emitting VCSEL, emission occurs away from the substrate 1008. As a result, the passive side 1010 corresponds to the substrate 1008 side of the VCSEL 1000.

In overview, since a non-ideal semiconductor laser will have a small amount of photon leakage out of the passive side, we place a small absorbing region on the passive side of the laser. The photon leakage, although not sufficient for highly accurate instantaneous compensation measurement purposes, will nevertheless produce a signal sufficiently proportional to the laser output to allow for, for example, laser compensation due to degradation over time (on the order of hours or longer), identification of an effectively or actually dead laser, or both.

This layer converts the small amount of leaked photons back into electricity, in the form of an electrical current, which can then be measured external to the laser device. If the total output power of the laser increases, the absolute value of the amount of leaked photons absorbed will increase. Similarly, if the total output power decreases, the absolute value of the amount of leaked photons absorbed will decrease.

This approach provides several advantages. Since nothing is placed on the output side, the intensity and/or quality of the output beam is not directly affected. In addition, the basic laser structure is not modified, making the approach suitable for use with commonplace or well established designs. The approach is also compatible with techniques used to hybridize lasers to electronic integrated circuits. Moreover, the approach is compatible with very dense integration techniques because the laser does not take up any additional area of consequence.

Figure 11:
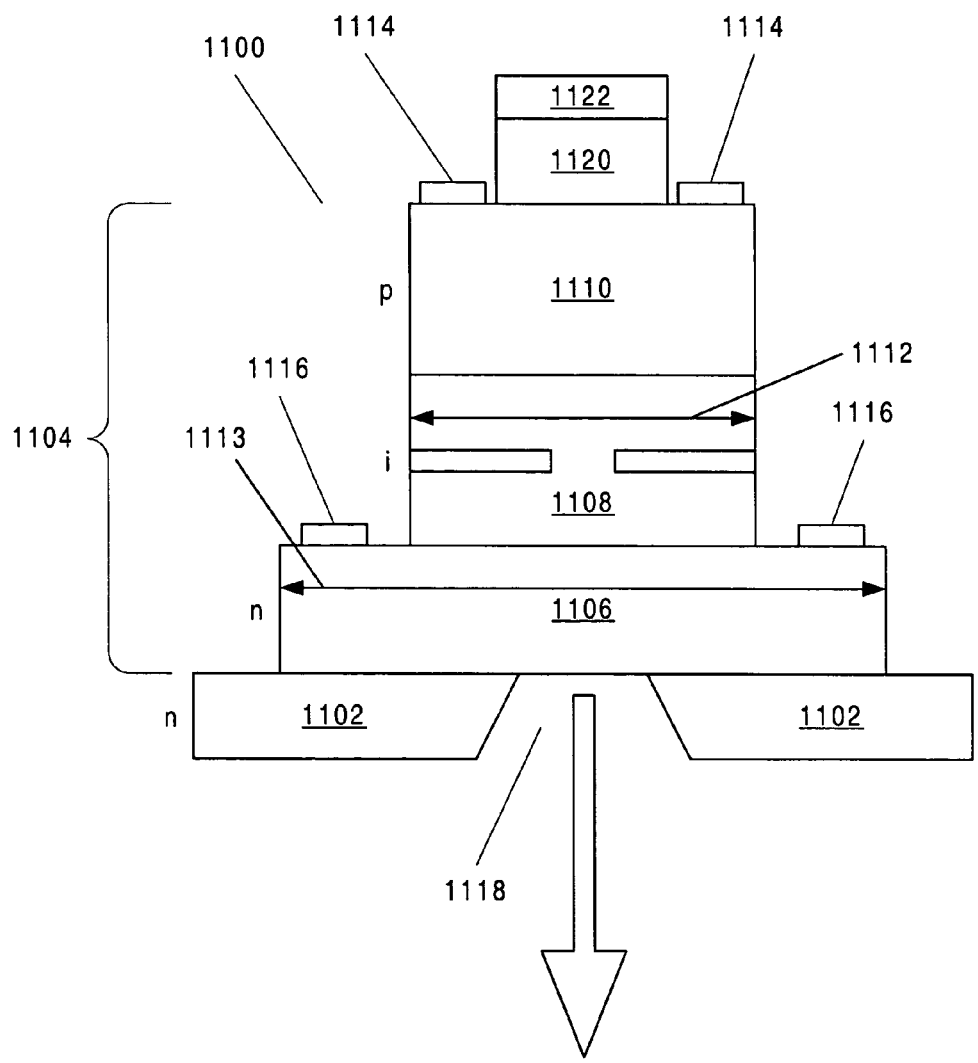
FIG. 11 is a highly simplified example of device 1100 implementing the invention.

FIG. 11 is a highly simplified example of device 1100 implementing the invention. In FIG. 11, the device 1100 comprises a substrate 1102 on which a VCSEL-type laser 1104 (illustratively a p-I-n type) has been grown. The VCSEL 1104 has a mirror 1106 abutting the substrate 1102, an active region 1108 on top of the mirror 1106, and a second mirror 1110 abutting but on the opposite side of the active region 1108. The width 1112 of the active region 1108 (referred to as the mesa width) is smaller than the width 1113 of the mirror on the active side of the device. Contacts 1114, 1116 on each of the mirrors provide for electrical connection of the laser to appropriate drive and/or control circuitry (not shown). An (optional) opening 1118 in the substrate, interchangeably referred to as an access way, ensures that the substrate is sufficiently thin or non-existent over the output surface of the laser to allow for the desired output.

A thin layer of material 1120 that will typically be less than two microns thick, for example, one micron thick layer, is placed on the passive side mirror 1110. A Schottky metal contact 1122 is formed on top of the material 1120 and is used for detection of a current produced in the material by the leaked photons. It should be noted that, while the design of many laser structures automatically result in some slight photon leakage out of the passive side mirror, if the particular design does not have sufficient leakage, a slight altering of the reflectivity of the passive side mirror can be made to increase the leakage without meaningfully affecting the laser's operation.

The material 1120 is selected so as to be an absorbing material at the wavelength the laser will operate at and can be lightly doped or undoped however, the greater the doping level, the less the region will get "depleted" by the Schottky contact. This lack of depletion will create an electric field across the material 1120 which can be used to sweep out carriers that are generated during light absorption.

Table 1 illustrates in further detail, the device 1100. The laser is made up of various layers of Carbon-doped AluminumGalliumArsenide (Al(x)GaAs) layers that form the p-type mirror of the laser, Silicon-doped AluminumGalliumArsenide and GalliumArsenide layers that form the n-type mirror of the laser, and the undoped AluminumGalliumArsenide and GalliumArsenide intrinsic layers that form the active region of the laser.

TABLE 1

| Layer | Material | Type/Dopant | Notes | |
|---|---|---|---|---|
| "25" | Metal | n/a | Schottkey Contact | |
| 24 | GaAs | None | Absorbing Region | Detector |
| 23 | Al(x)GaAs | P/Carbon | Bottom | Laser |
| 22 | Al(x)GaAs | | (passive) | |
| 21 | Al(x)GaAs | | Mirror | |
| 20 | Al(x)GaAs | | | |
| 19 | Al(x)GaAs | | | |
| 18 | Al(x)GaAs | | | |
| 17 | Al(x)GaAs | None | Intrinsic | |
| 16 | Al(x)GaAs | | Active | |
| 15 | GaAs | | Region | |
| 14 | Al(x)GaAs | | | |
| 13 | GaAs | | | |
| 12 | Al(x)GaAs | | | |
| 11 | Al(x)GaAs | | | |
| 10 | Al(x)GaAs | N/Silicon | Top | |
| 9 | Al(x)GaAs | | (emission) | |
| 8 | Al(x)GaAs | | Mirror | |
| 7 | Al(x)GaAs | | | |
| 6 | Al(x)GaAs | | | |
| 5 | Al(x)GaAs | | | |
| 4 | Al(x)GaAs | | | |
| 3 | GaAs | | | |
| 2 | Al(x)GaAs | | etch stop | |
| 1 | GaAs | | buffer layer | |
| 0 | GaAs Si 3" 625 microns | | Substrate | |

For purposes of illustration only, the material 1120 in Table 1 that makes up "layer 24" and is an undoped, semi-insulating material, for example GalliumArsenide (GaAs).

As is evident, the configuration of FIG. 11 is a three terminal configuration. The three terminals or contracts correspond to a) the positive terminal of the laser, b) the negative terminal of the laser, and c) the Schottky contact. In use, the current measurement proportionally representing the output of the laser is taken between one of the laser contacts and the Schottky contact.

In order to effectively do so, the proper material must be selected so that a Schottky contact, as opposed to an to an ohmic contact is formed. Since the process for formation of a Schottky contact per se is known, a detailed discussion is unnecessary here. However, for completeness, a brief side discussion of pertinent details related to formation of an example Schottky contact for use, for example, with a device as described herein in connection with FIG. 11 is set forth below with the understanding that other Schottky contacts using other materials, for example, Titanium (Ti), Gold (Au), Nickel (Ni) and Platinum (Pt) to name a only a representative few.

Figure 12:
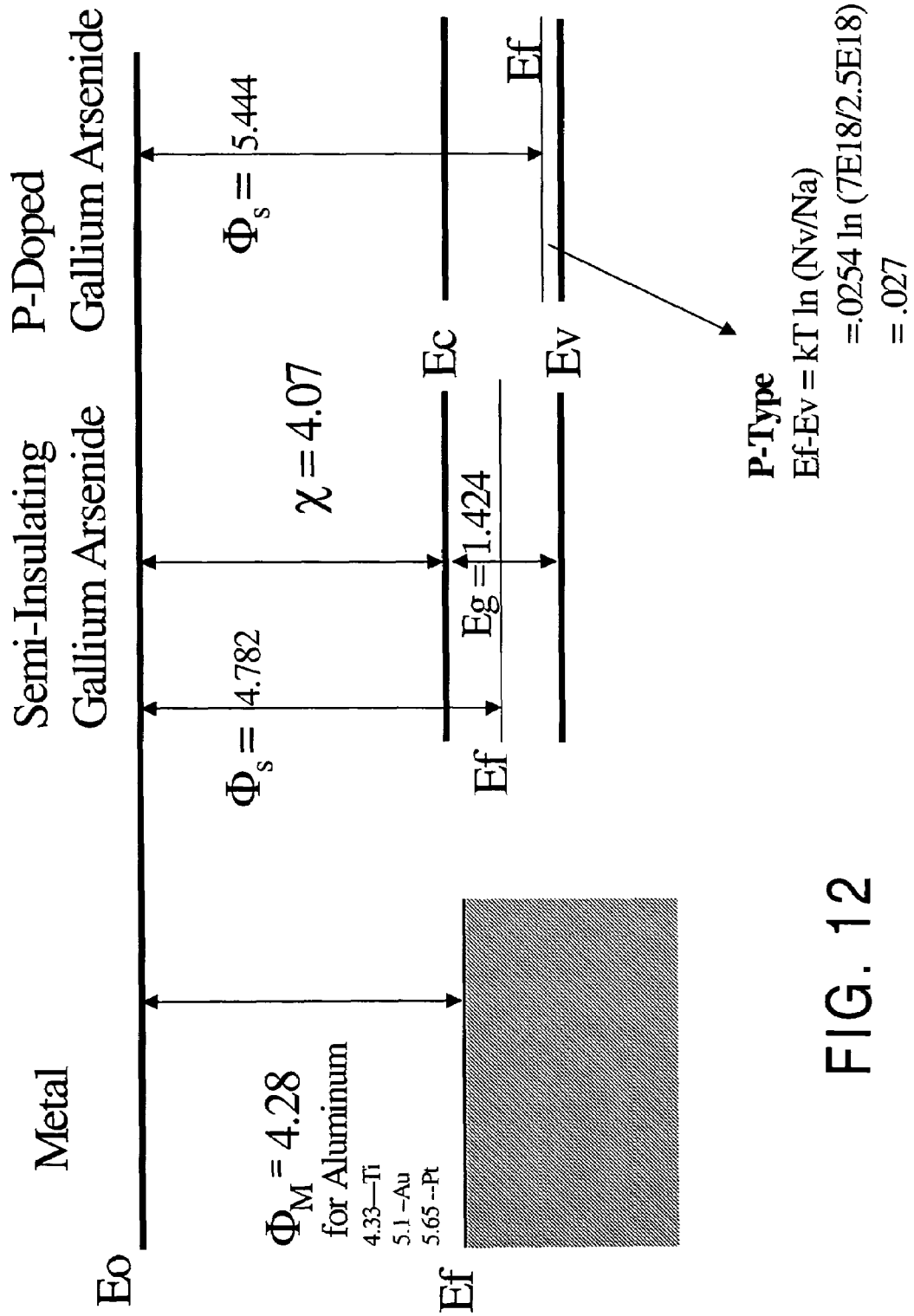
FIG. 12 is a band diagram for a more "real world" example device similar to the device of FIG. 11.

In that regard, FIG. 12 is a band diagram for a more "real world" example device similar to the device 1100 of FIG. 11 having a Schottky contact of aluminum (Al), an absorbing region of Gallium Arsenide and a passive side mirror of p-type Gallium Arsenide, where E0 represents the base potential energy, Ef represents the Fermi level such that the energy to get the electrons out is the difference between E0 and Ef, $\Phi_M$ is the work function for the particular metal, $\Phi_S$ is the work function for the particular semiconductor material, Eg is band gap energy difference, Ec is the energy of the conduction band, and Ev is the energy of the valence band.

In general, the materials should be selected such that where the passive side mirror is p-type, the work function of the semiconductor should be greater than the work function of the metal and where the passive side mirror is n-type, the work function of the metal should be greater than the work function of the semiconductor.

Figure 13:
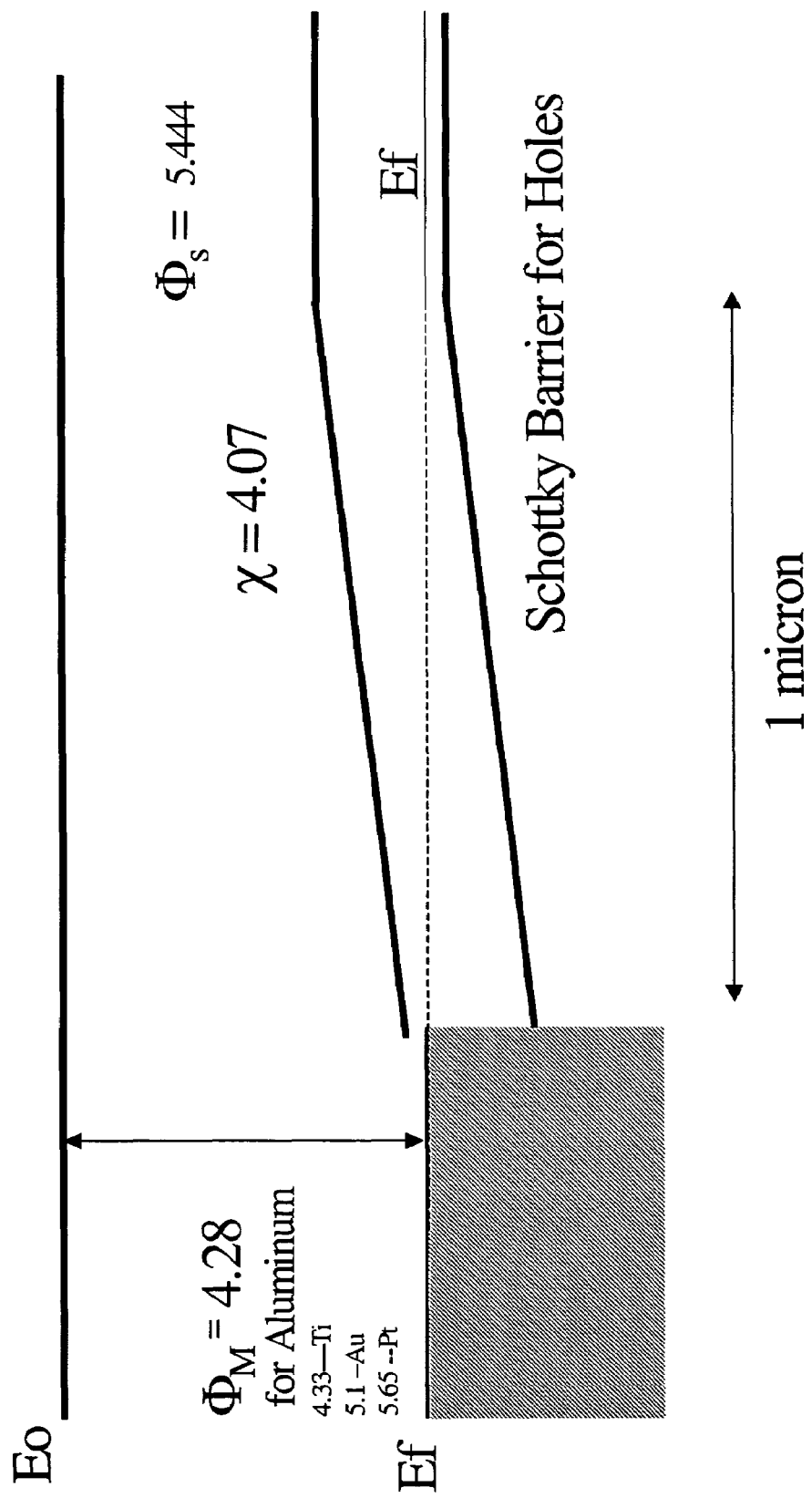
FIG. 13 is a band diagram for the Schottkey barrier of FIG. 12 involving a one micron thick absorbing region.

FIG. 13 is a band diagram for the Schottky barrier of FIG. 12 involving a one micron thick absorbing region.

This configuration operates as follows. When the laser is operating, the bulk of the photons exit the emission side of the laser. However, a small percentage of the generated photons leak out the passive side and they do so in statistical proportion to the laser emission output. Those "leaked" photons enter the absorbing region where the light power is converted to electrical power. The electrical power is then measured by the Schottky detector via the Schottky contact and, based upon the measurement, appropriate adjustments or a determination of whether the laser is effectively or actually dead can be made.

The configuration of FIG. 11 is, however, not suitable for some applications. This is because, for operation of the configuration of FIG. 11, in order to bias the laser for lasing, the p-contact must be biased positively with respect to the n-contact. However, for the Schottky detector, the Schottky contact must be: a) biased positively with respect to the Schottky detector's other contact when that other contact is connected to a p-type layer; or b) biased negatively with respect to the Schottkey detector's other contact when the other contact is connected to an n-type layer. In addition, it is desirable to keep the overall voltage levels as low as possible. Thus, in an ideal situation, one would use all the voltage for the laser. However, biasing the Schottky detector contact requires some voltage and therein detracts from the laser voltage which, in some cases, could limit the operation of the laser.

By way of explanation, with a laser requiring 2.3 volts to operate biased by a fast transistor-based circuit having a 0.7 volt drop, the total voltage drop for both is about 3.0 volts. Since many systems in which semiconductor laser devices operate are typically 3.3 volt systems, a maximum of 0.3 volts is available for use with the detector and, in some cases, this may be an insufficient voltage.

For lasers having the n-type laser layer closest to the substrate the situation is similar. The desire to switch the lasers fast as well as the inherent speed advantage of NMOS (and NPN) transistors relative to PMOS (and PNP) transistors, results in the p-contact of a laser being held constant and the n-contact being the one modulated to control the laser. In such a situation, for example, the p-contact of the laser could be held at 3.3 volts and the n-contact could be swung between 3.1 volts and 1 volt. In such a case, if the p-contact layer is held at the maximum supply voltage (in this case 3.3 volts) in order to get the maximum range for the laser, then there would be no additional voltage available to forward bias the Schottky contact relative to the p-contact. Of course, the same is essentially the case for circuits which use current steering or current switching because, while voltage itself is not modulated, the effect of pulling current through a laser nevertheless affect the voltage across the laser in a similar manner.

Figure 14:
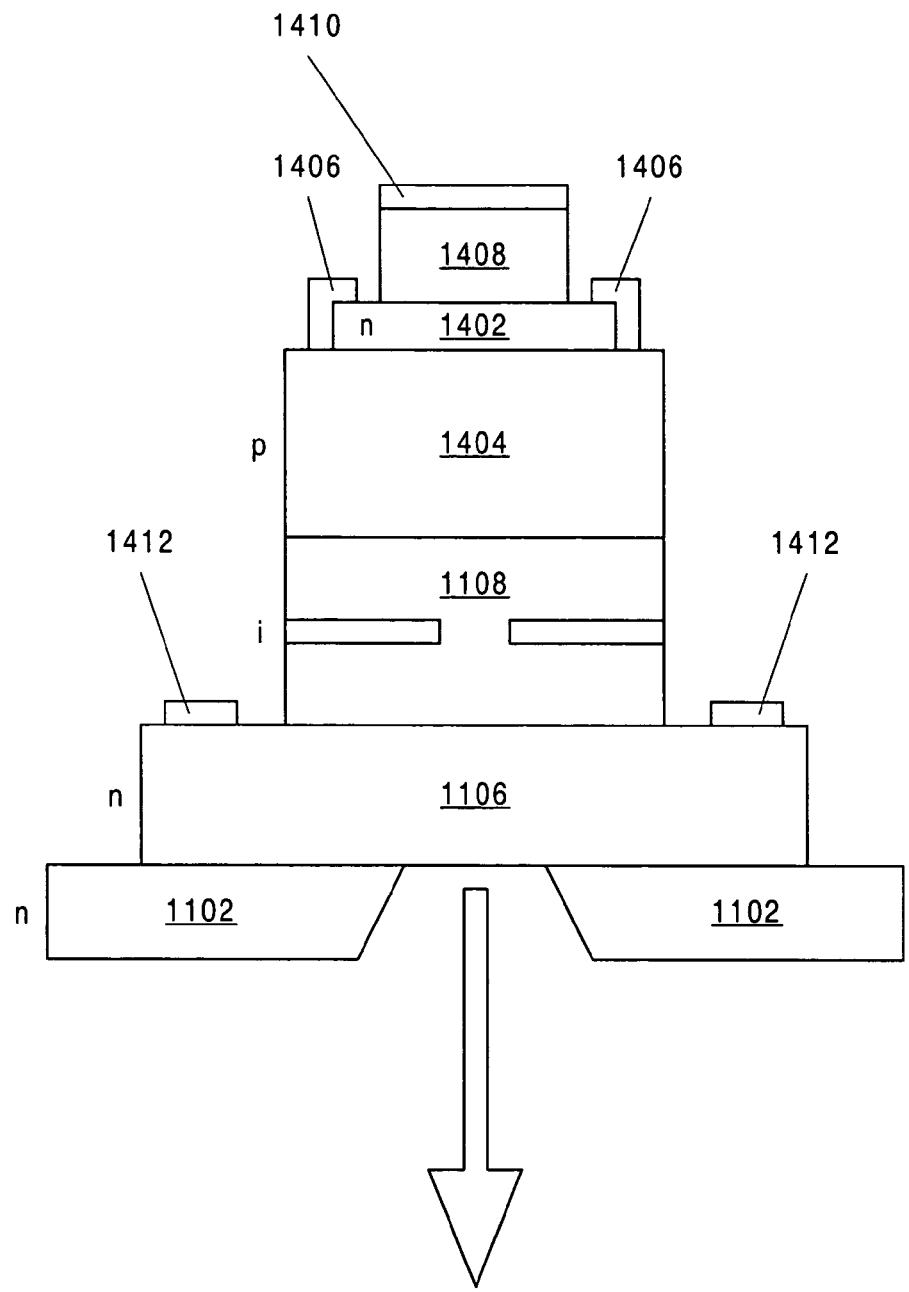
FIG. 14 is a simplified example of a laser device 1400 implementing the invention.

FIG. 14 is a simplified example of a laser device 1400 implementing the invention in such a situation as described immediately above. As shown in FIG. 14, an n-type region 1402 is grown at the top of the upper p-type region that comprises the top mirror 1404. Depending upon the particular implementation, the n-type region 1402 can be in addition to the top mirror 1404 or can comprise the top of the mirror itself (not shown). An absorbing region 1408 and a Schottky contact 1410 are respectively layered on top of the n-type region 1402. Moreover, the n-type region 1402 can be left floating (i.e. it has no applied voltage) or can be shorted to the p-type mirror 1404. As shown in FIG. 14, the two are connected (i.e. in the shorted configuration) by the upper contact 1406.

Referring back to the above situations problematic for the implementation of FIG. 11, specifically where the n-type laser contact is modulated, in the implementation of FIG. 14, both the p-type region 1404 and the overgrown n-type region 1402 could be held at 3.3 volts. Now however, the Schottky contact 1410 layer is referenced to the n-type absorbing region 1402 (an n-type schottky diode). This means that the Schottky contact 1410 can be biased negatively with respect to the n-contact (and thus the p-contact for the laser). Thus, the laser p-type region 1404 can be at 3.3 volts and the laser's n-type region contact 1412 can be modulated as above, but the Schottky contact 1410 can be held at 0 volts, for example, making it possible to apply the maximum field across the Schottky diode 1402 and thus get the greatest percentage of photogenerated carriers out of the Schottky diode 1402.

Figure 15:
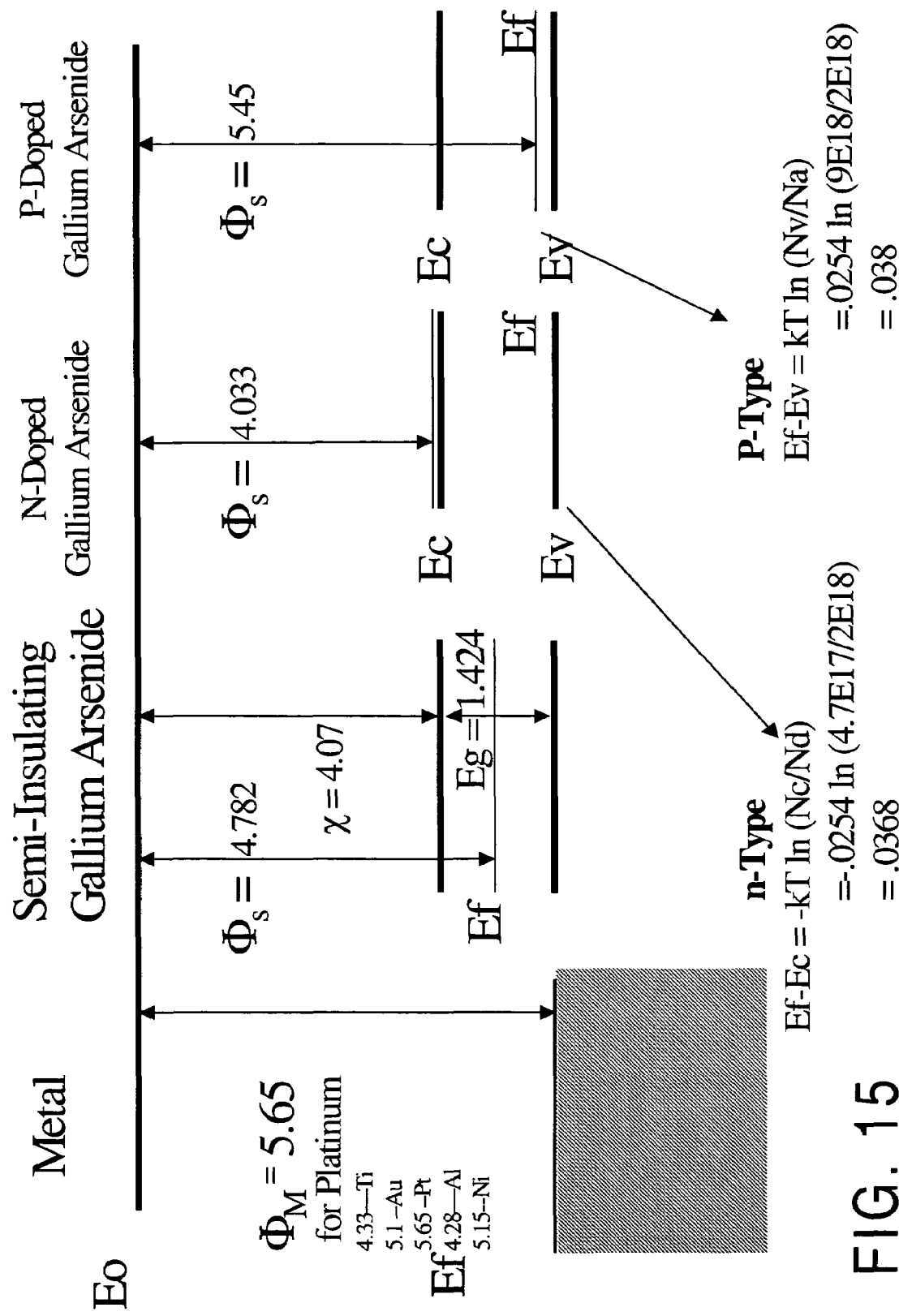
FIG. 15 and FIG. 16 are band diagrams similar to those of FIG. 12 and FIG. 13 for an example device having a p-doped GaAs passive side mirror and configured such as shown for the device 1400 of FIG. 14.
Figure 16:
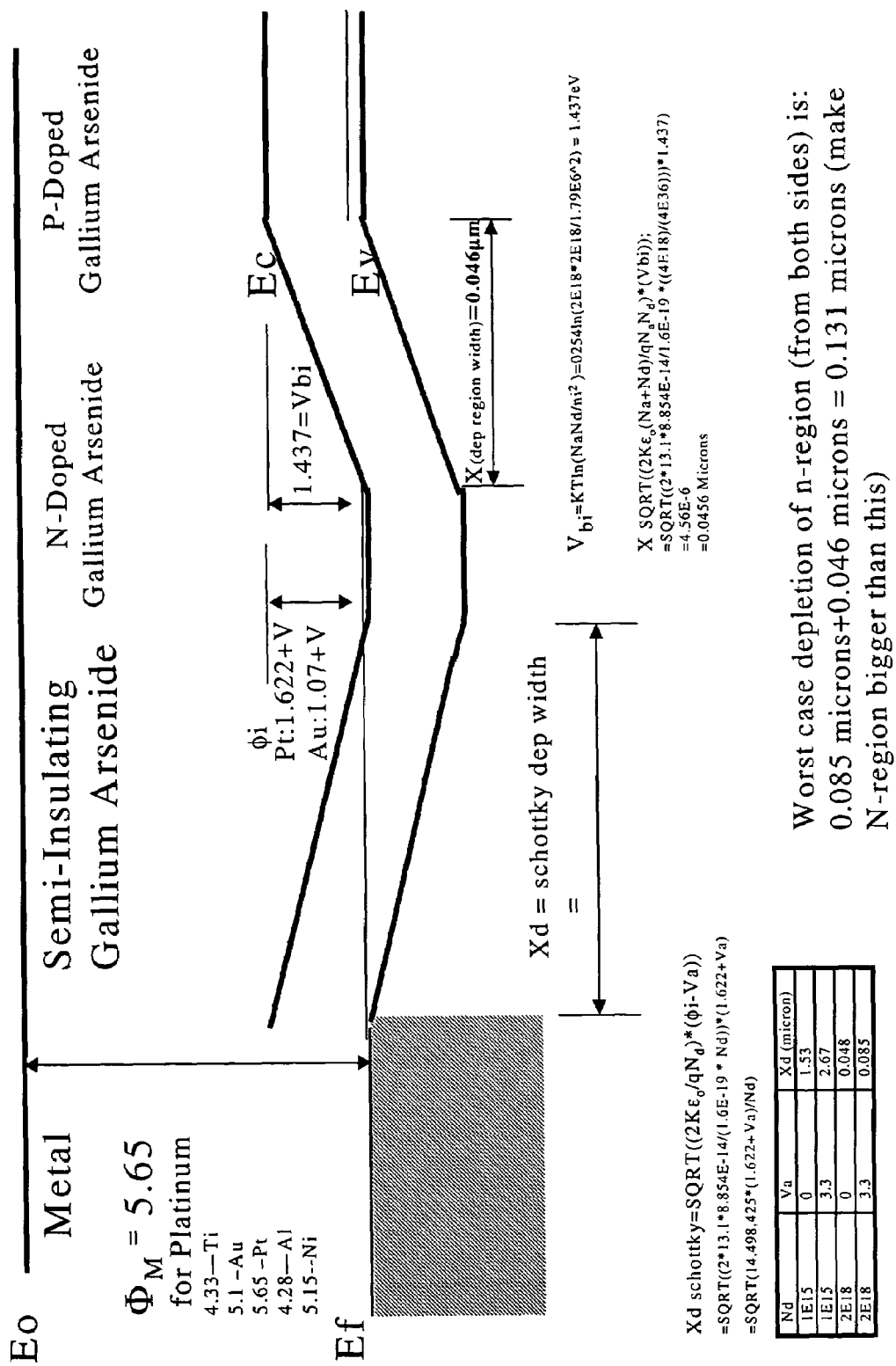

FIG. 15 and FIG. 16 are band diagrams similar to those of FIG. 12 and FIG. 13 for an example device having a p-doped GaAs passive side mirror and configured such as shown for the device 1400 of FIG. 14.

Figure 17:
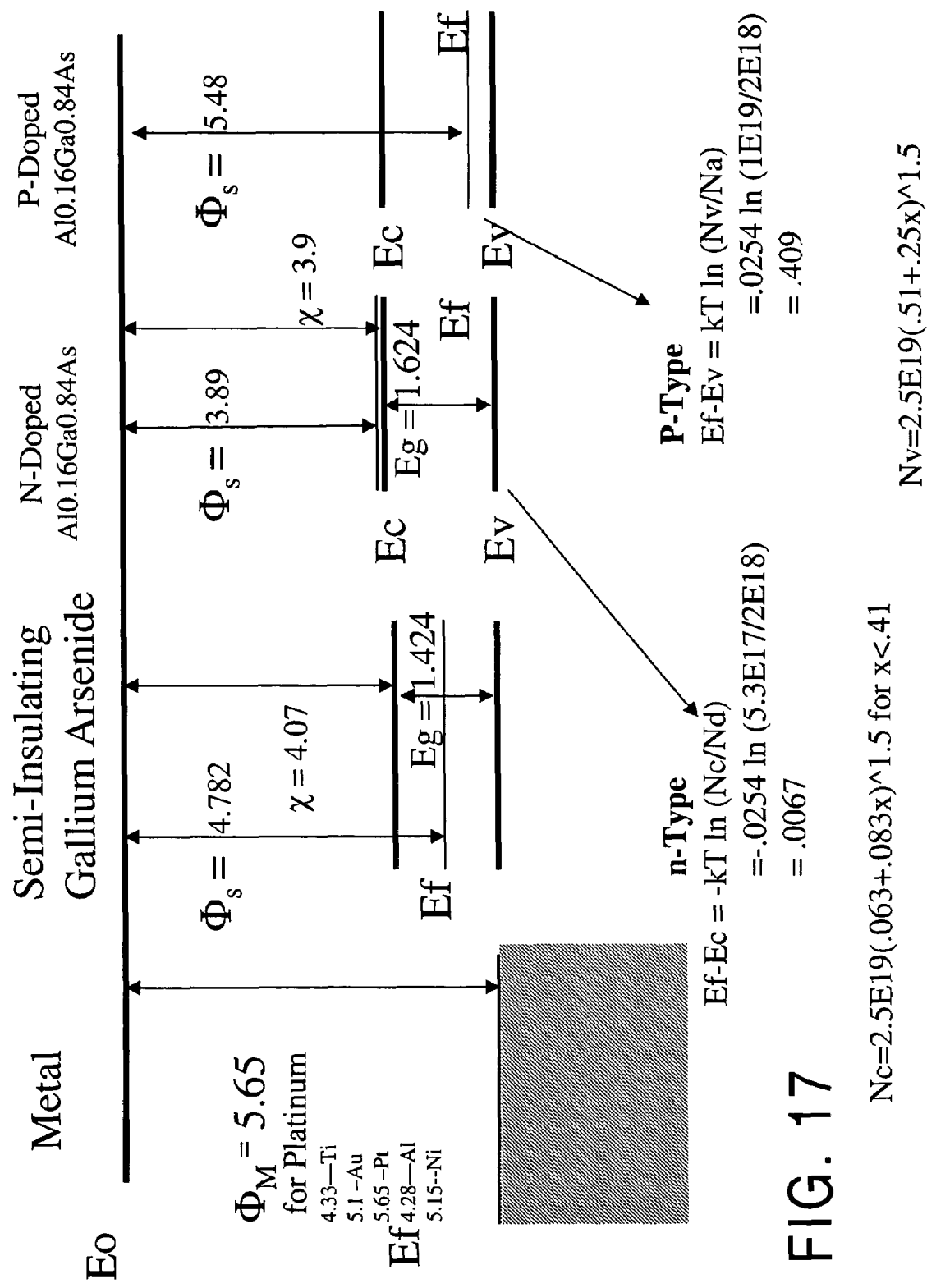
FIG. 17 and FIG. 18 are band diagrams similar to those of FIG. 15 and FIG. 16 for an alternative example device.
Figure 18:
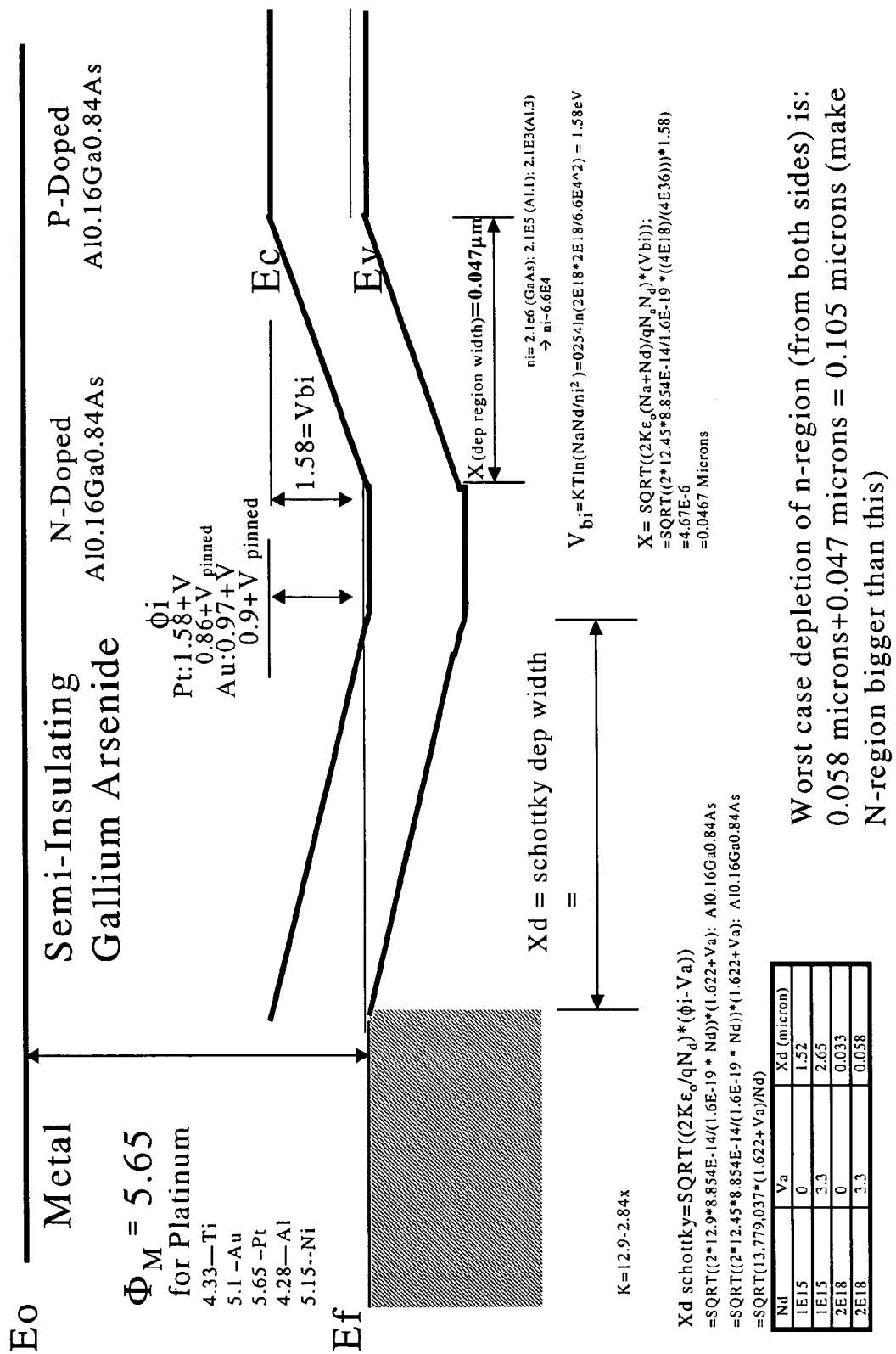

FIG. 17 and FIG. 18 are band diagrams similar to those of FIG. 15 and FIG. 16 for an alternative example device having a p-doped Al(x)GaAs passive side mirror configured such as shown for the device 1400 of FIG. 14, specifically using $Al_{0.16}Ga_{0.84}As$.

Returning to the more pertinent aspects, up to now the above discussion has been focused primarily on bottom emitting (also called back side emitting) lasers. However, the invention is equally applicable to top emitting lasers. Moreover, for top emitting lasers, in some implementations, the benefits of using back side (i.e. substrate side) Schottky contacts can be even greater relative to the benefits achievable with bottom emitting lasers. This is because, in the top emitting laser variant the detector device does not need to be located on the device mesa. As a result, tolerances for processing the devices in terms of contact size and mesa size can be relaxed. This is an advantage that can be critical for some high performance devices.

Figure 19:
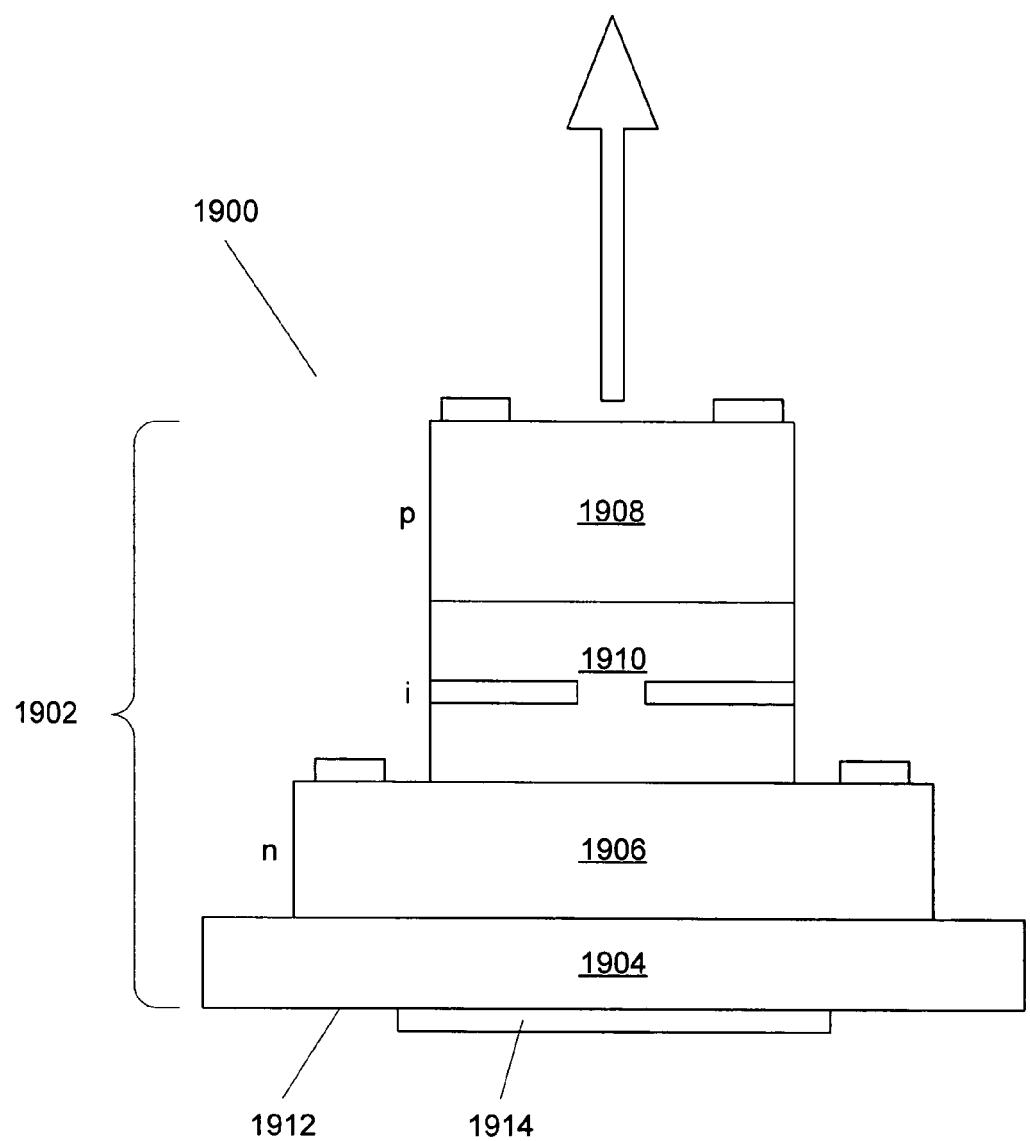
FIG. 19 through FIG. 21 are highly simplified examples of top emitting laser devices implementing the invention.
Figure 20:
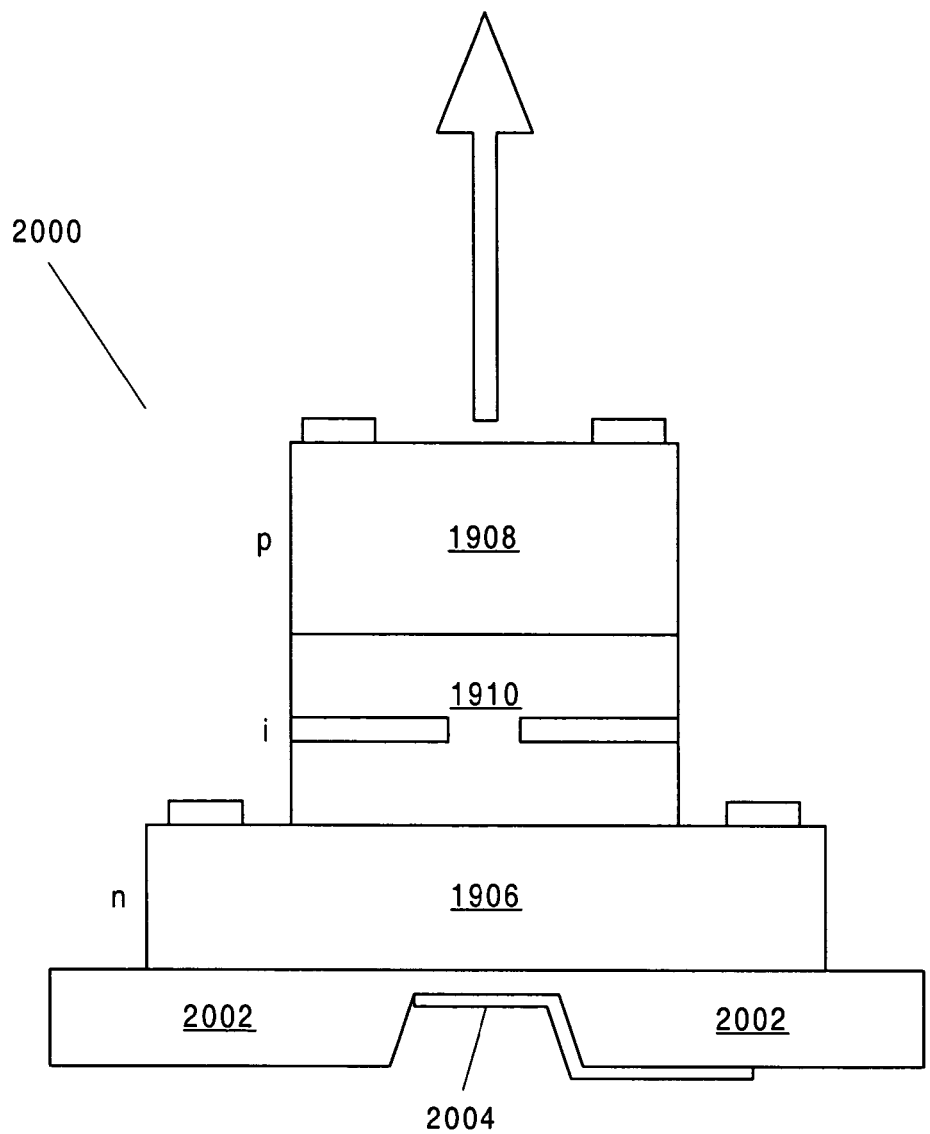
Figure 21:
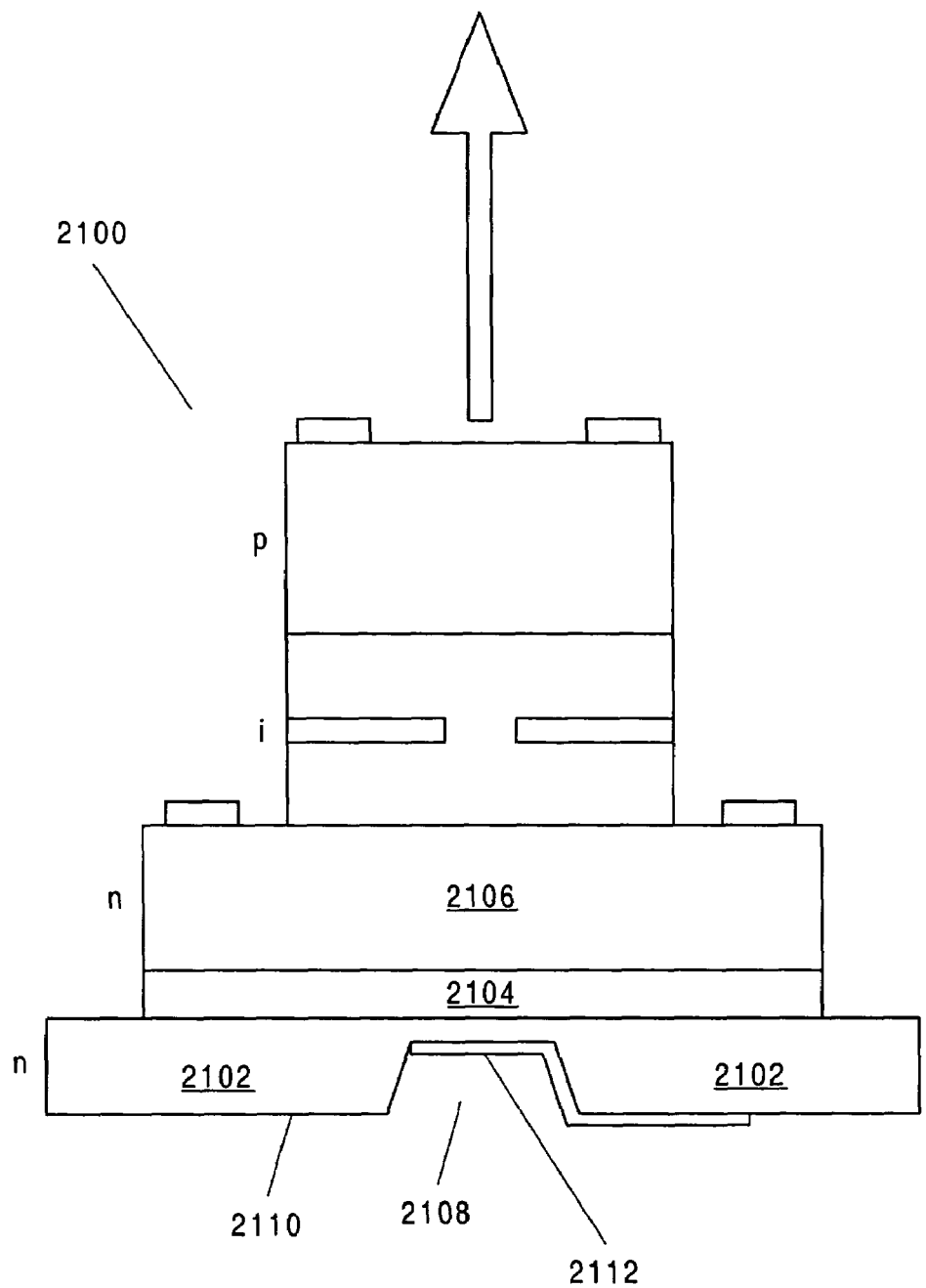

FIG. 19 through FIG. 21 (inclusive) are highly simplified examples of top emitting laser devices 1900, 2000, 2100 implementing the invention.

FIG. 19 is a simplified example of a device 1900 incorporating the invention. As with the devices using bottom emitting lasers, the device of FIG. 19 includes a laser 1902 made up of a substrate 1904, a bottom (i.e. passive side) mirror 1906, a top (i.e. emission side) mirror 1908, and an active region 1910 between the bottom mirror 1906 and top mirror 1908. The substrate 1904 is a material that absorbs the wavelength(s) that the laser emits. As shown, the substrate 1904 is also a semi insulating material. As a result, photon leakage into the substrate 1904 generates photocarriers. If the substrate 1904 is not too thick (i.e. it is sufficiently thin to allow for collection of the photocarriers) it can be used as the absorbing (i.e. Schottky diode) material as described above. As a result, a Schottky contact 1914 can be placed on the back side 1912 of the substrate 1904. The arrangement thereafter operates in the same manner as the bottom active implementation, i.e. photon leakage generates a current roughly proportional to the output that is picked up by the Schottky contact 1914.

In some cases a substrate may be too thick to allow for its direct usage as an absorbing region. Nevertheless, the invention can be implemented through, for example, resort one of two alternative example approached. In the first approach, the thickness of entire back side of the substrate can be reduced, for example, using a chemical-mechanical process (CMP), a chemical process such as etching or a physical process such as polishing or grinding, until it is sufficiently thin to act as the absorbing region (ideally a thickness of only a few microns). This will allow for the Schottky contact to be placed sufficiently close. The second approach reduces the thickness in the area underneath the passive side of the laser itself, for example, using a chemical process, such as through paterning and an (isotropic or anisotropic) etching process, or using a physical process, such as a mechanical or laser drilling process, to bring the substrate down in the pertinent area to a suitable depth as noted for the first approach. As will be evident, the first approach offers the advantage of being simple in terms of processing because the entire surface is uniformly processed, whereas the second approach offers the advantage of greater structural strength, since much of the substrate will remain fairly thick and also/alternatively allows for pattern etching of trenches into the substrate so that the entire substrate can, thereafter, be coated with a metal (using any suitable process such as sputtering, vapor deposition, electro or electroless plating etc.) which will coat the walls of, or fill, the trenches so that the trenches in the substrate will become electrically conductive traces directly or, for example, through subsequent processing, such as CMP, a purely chemical process such as a chemical etch, or a purely mechanical process such as polishing.

FIG. 20 is a simplified example of a device 2000 incorporating the invention, virtually identical to the device 1900 for FIG. 19, but in the case where the substrate 2002 was originally too thick to be used as the absorbing region. As shown, the substrate 2002 has been reduced in a specified area by patterning and etching using an isotropic etching process so as to form an inwardly facing opening. The Schottky contact 2004 is then formed or placed inside the opening using, for example, a sputter deposition or other suitable process.

While the above will work for top emitting laser cases where the substrate is semi-insulating or undoped, in some cases the substrate that the top emitting laser is grown will be a doped substrate. In such cases, the doping can limit the effective size of the absorbing region, rendering it less suitable for per se use in implementing the invention. Nevertheless, implementations of the invention can be created even in cases where the substrate is doped.

FIG. 21 is a simplified example of a device 2100 incorporating the invention wherein the substrate 2102 is a doped substrate. To implement the invention, a semi-insulating layer 2104 is grown either under or as part of the passive side mirror 2106. The semi-insulating layer 2104 will act as the absorbing region for the device. An opening 2108 is then made in the substrate 2102 from the rear side 2110 of the substrate 2102 so as to expose a suitable area of the semi-insulating layer 2104 to access from the rear side 2110. The Schottky contact 2112 is then formed as noted above and connects with the absorbing region 2104 through the substrate 2104 via the opening 2108.

Throughout the above discussions, the lasers shown and described were all of the p-i-n type where the n-doped mirror is always closest to the substrate. It should be understood however, that the invention can be used where the layer dopings are reversed, i.e. n-i-p type devices where the p-doped mirror is closest to the substrate. Thus, advantageously, the above approach can be used, even if a specific configuration necessitates adding another layer and shorting contacts as described in connection with FIG. 14.

It is to be understood that, although carbon has been referred to for the "P" type dopant other known "P" type dopant, such as berrilium or zinc for example, could be readily used. Similarly, while silicon has been mentioned for the "n" type dopant, other known "n" type dopants such as tellurium could be used. This is the case because neither the specific dopants nor particular materials or lasers used to form the laser structure (i.e. the mirrors and active region) are critical for implementating the invention.

Representative Example Applications for the Invention

While the above description has centered on implementations of the invention with respect to a single semiconductor laser, using wafer scale processing techniques such lasers can be simultaneously collectively formed by the tens to the ten-thousands or more. As a result, laser arrays incorporating from two to many thousands of such lasers can be created and previously unavailable benefits can be achieved. For purposes of illustration, two example applications for implementations of the invention follow, recognizing that numerous other applications can benefit from use of the invention, whether implemented with a single laser or an array of lasers.

In the case where an array of the lasers implementing the invention are collectively used as a pumping laser, the individual lasers can be monitored so that as the overall power of any one or more individual laser degrades over time, this degradation can be identified quickly during operation and can be compensated for by adjusting, for example the bias and/or modulation current for that (those) laser(s). Similarly, if a laser becomes effectively (or actually dead), through use of the invention, this can also be recognized quickly and the remaining (n−1) lasers can be adjusted to compensate for the loss by slightly increasing the output power of the remaining lasers to add an additional 1/(n−1)th of their individual power to their actual power output.

One example of a very accurate high power laser made from an array of many dicrete low power semiconductor lasers that can benefit from the invention described herein is described in commonly assigned U.S. patent application Ser. No. 10/180,367 (the entire disclosure of which is incorporated herein by reference). By use of the invention the output power can be very accurately controlled to account for output variations among the individual lasers, variations of the overall device due to degradation over time and temperature fluctuations, etc.

Another example application involves the use of an array of multiple wavelength lasers such as shown and described in commonly assigned U.S. patent application Ser. No. 10/180,603 (the entire disclosure of which is incorporated herein by reference). By use of the invention in that arrangement aging or degradation realted drift can be accounted for.

In other cases, where redundant lasers are used (i.e. those having redundant active regions that can be individually selected and switched among or where two or more discrete individual lasers are configured so that one laser can be substituted for another in the event one fails), through use of the invention, recognition that a laser is effectively or actually dead can be achieved—allowing for automatic switchover (i.e. fail-over) and/or failure alert to occur. As a result, higher MTBFs for the array can be achieved in excess of what could be achieved without redundancy and in a manner that is wholly transparent to the user.

An example of a redundant laser arrangement that can benefit from the invention is described in commonly assigned U.S. patent application Ser. No. 09/896,797 (the entire disclosure of which is incorporated herein by reference).

Further Alternative Implementations

Depending upon the particular application in which the invention will be used, it may be desirable to hybridize the lasers to an electronic chip comprising, for example, the electronic drive and control circuitry for the laser(s). Connecting the lasers to an electronics chip can be accomplished through, for example, wirebonding, or by hybridizing them together using a technique such as shown and described, for example, in commonly assigned U.S. patent application Ser. Nos. 09/896,189, 09/896,665, 09/896,983, 09/897,158, 09/897,160 the entire disclosures of which are each incorporated herein by reference.

When a hybridization approach is used, the Schottky contact can, in some implemetations, originate as part of the electronic integrated circuit (IC) as opposed to being part of the optical IC (i.e. the chip the lasers are part of). This alternative approach is illustrated in FIG. 22 and FIG. 23.

Figure 22:
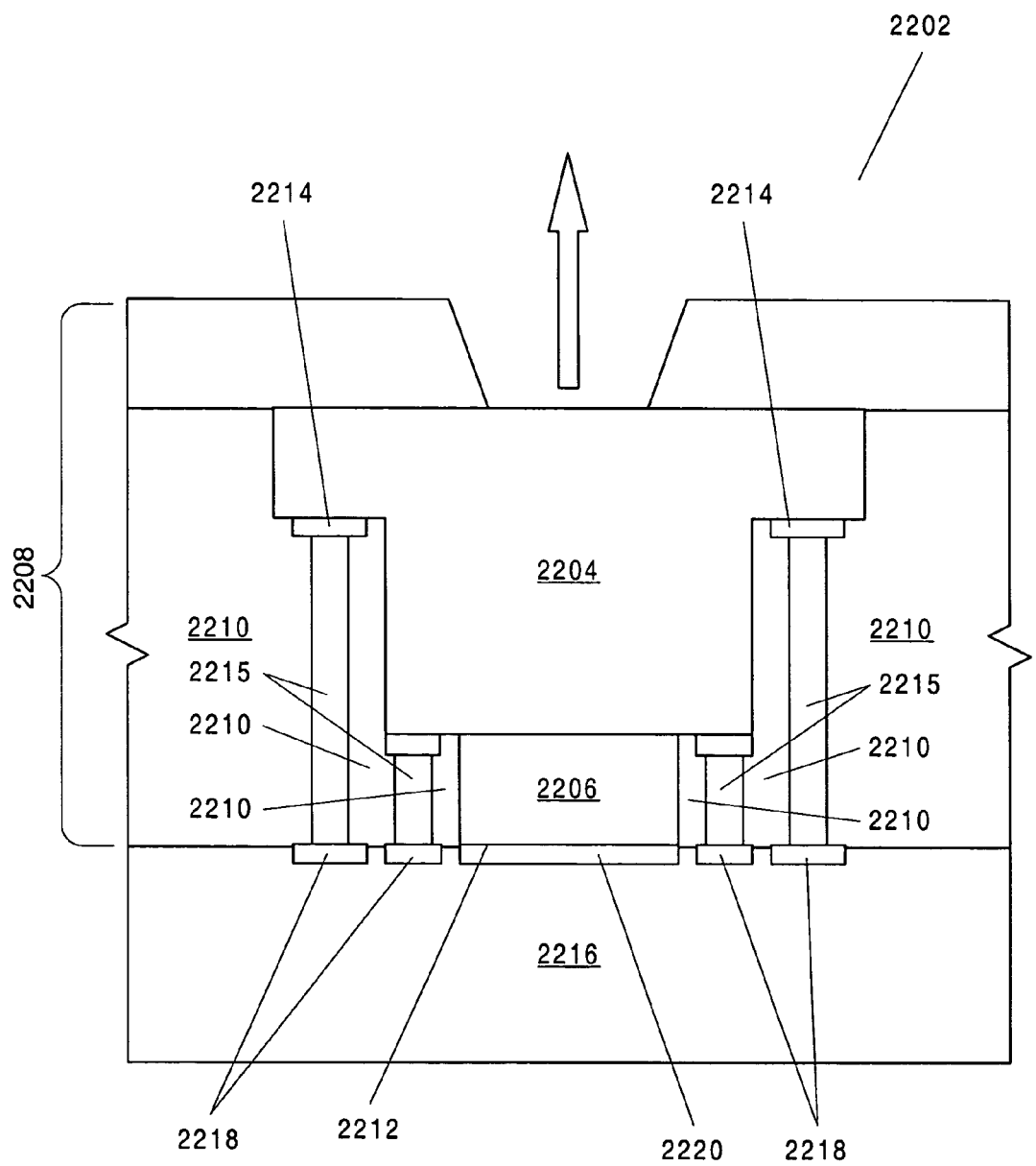
FIG. 22 is a simplified illustration of a portion of a device comprising a laser array using an alternative approach with bottom emitting laser(s)
Figure 23:
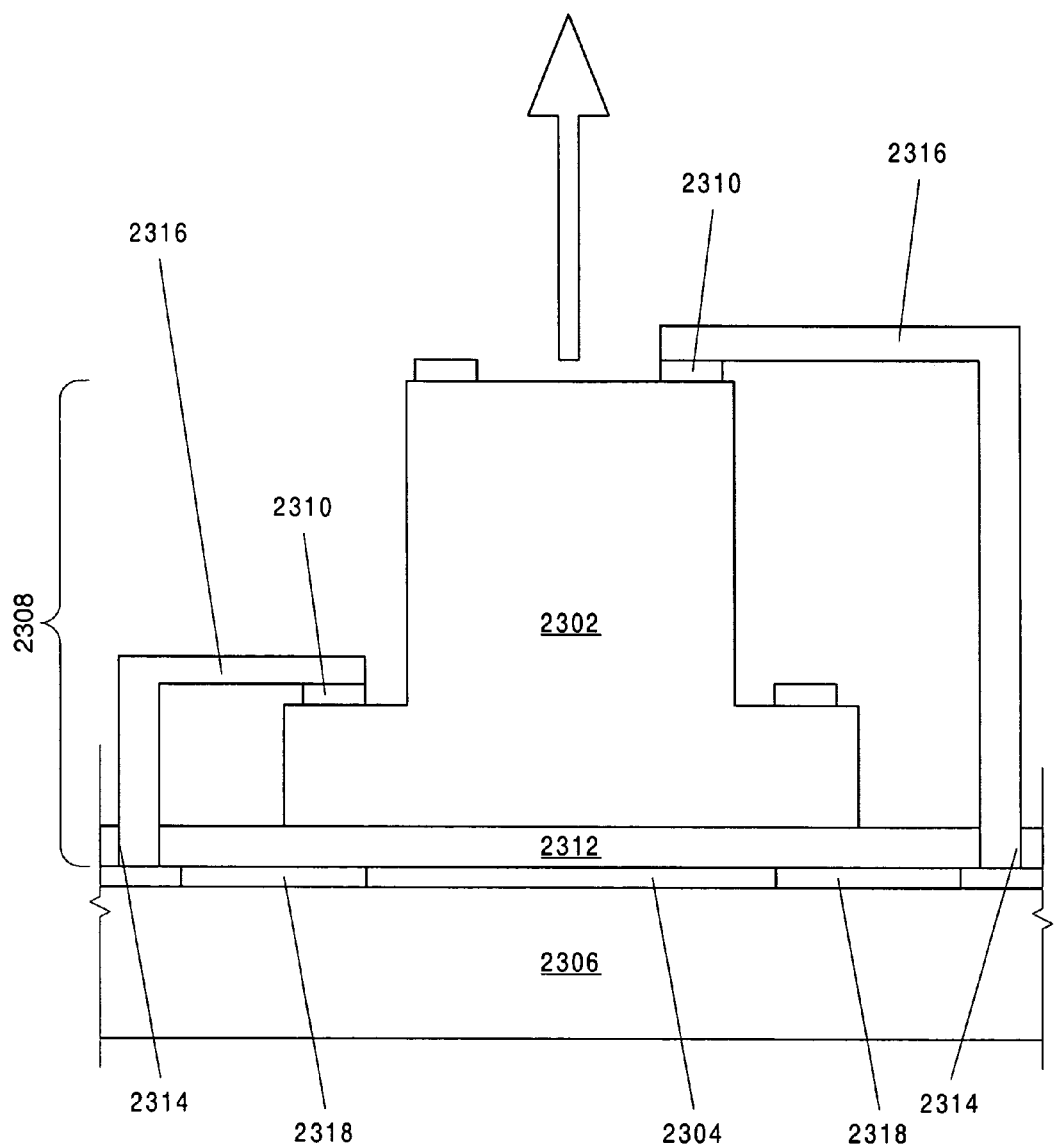
FIG. 23 is a simplified illustration of an alternative approach implemented with a top emitting laser.

FIG. 22 is a simplified illustration of a portion 2202 of a device 2200 (not shown) comprising a laser array using this alternative approach with bottom emitting laser(s). The laser 2204 shown is configured as described above in connection with FIG. 11 except, while the absorbing region 2206 is part of the laser-bearing chip 2208, it has no Schottky contact. A dielectric 2210 coats the laser(s) 2204 and is used to "planarize" the rest of the laser-bearing chip 2208 with the outwardmost surface 2212 of the absorbing region 2206. The device contacts 2214 are brought out through the dielectric 2210 to the level surface 2212, for example by etching through the dielectric 2210 to the contacts 2214 and filling the hole with a metal or other electrically conductive material 2215.

A electronic chip 2216, to which the laser-bearing chip 2208 is hybridized, comprises a set of electrical contacts 2218 that correctly electrically correspond with the device contacts 2214 and a Schottky contact 2220 placed so that when the chips 2208, 2216 are hybridized together it properly connects to the absorbing region 2206.

As a side note not critical for understanding the invention, it should be understood that if the electronic chip contacts 2216 extend above the outer surface of the electronic chip 2216 itself, it may be optionally be desirable to "planarize" that surface as well to ensure the best contact between the two chips 2208, 2216.

FIG. 23 is a simplified illustration of this alternative approach implemented with a top emitting laser. This approach similar to the approach discussed with respect to FIG. 22 except for the use of top emitting laser(s) 2302. As with FIG. 22, in the implementaion of FIG. 23, the Schottky contact 2304 is part of the electronic chip 2306 to which the laser-bearing chip 2308 will be hybridized and the device contacts 2310 are brought into contact with the electronic chip 2306 through the substrate 2312, for example, by etching an opening 2314 in the substrate 2312 and making the opening 2314 electrically conductive using a deposition or other filling process or passing a wirebond 2316 through the opening 2314. Of course, an optional planarizing dielectric 2318 can also be used.

Figure 24:
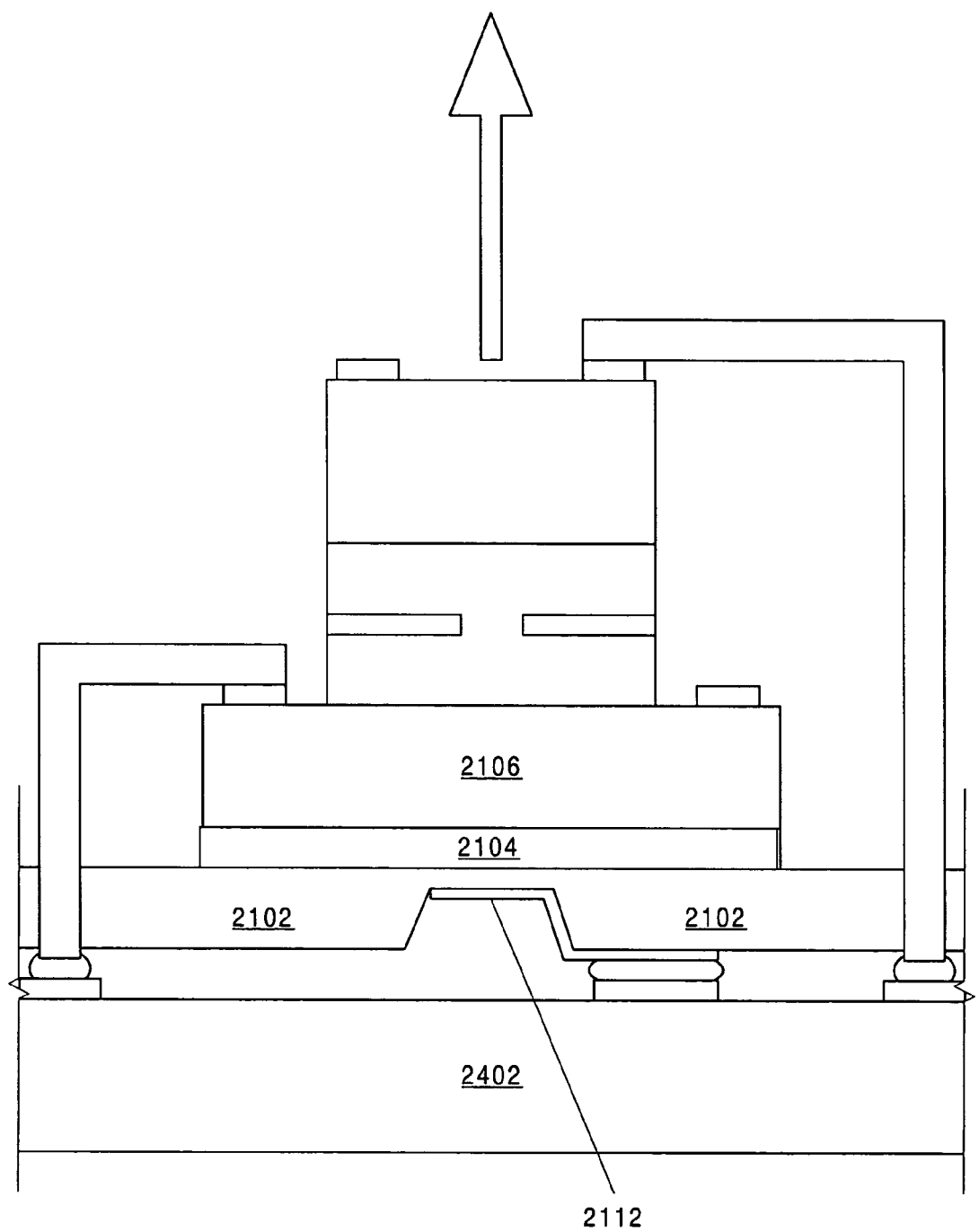
FIG. 24 illustrates a portion of a unit, specifically a single laser from the chip of FIG. 21, after the chip has been connected to an electronic chip.

FIG. 24 illustrates a portion of a unit 2400, specifically a single laser from the chip 2100 of FIG. 21, after the chip 2100 has been connected to an electronic chip 2402.

Once the optical device bearing chip(s) connect to the electronic chip(s) (whether by hybridization, wire bonding, or other approach) the connected devices can be used, for example, in a network or communication system as follows. For simplicity, hereafter, we refer to the laser devices and electronic chip(s) combination as an "opto-electronic unit". The opto-electronic unit is set up to, for example, periodically or continually monitor the output from the detector (comprising the passive side absorbing region and Schottky contact) and compute new $I_{bias}$ and $I_{mod}$ mod settings as necessary based upon that output.

If the electronic chip has an associated temperature sensor (which may be separate or integrated with either chip in the unit), that information can also be used in calculating the new $I_{bias}$ and $I_{mod}$ setting(s).

Furthermore, in designs that include redundant (i.e. backup) lasers, the electronic chip can further comprise logic or contain a processor running program code that will decide to switch to a backup laser if, for example, a laser fails or is effectively dead (i.e. it is impossible to set an $I_{bias}$ and $I_{mod}$ sufficient to get the power to the desired level necessary to allow the laser to emit light at an appropriate level to fit within a specification).

Figure 25:
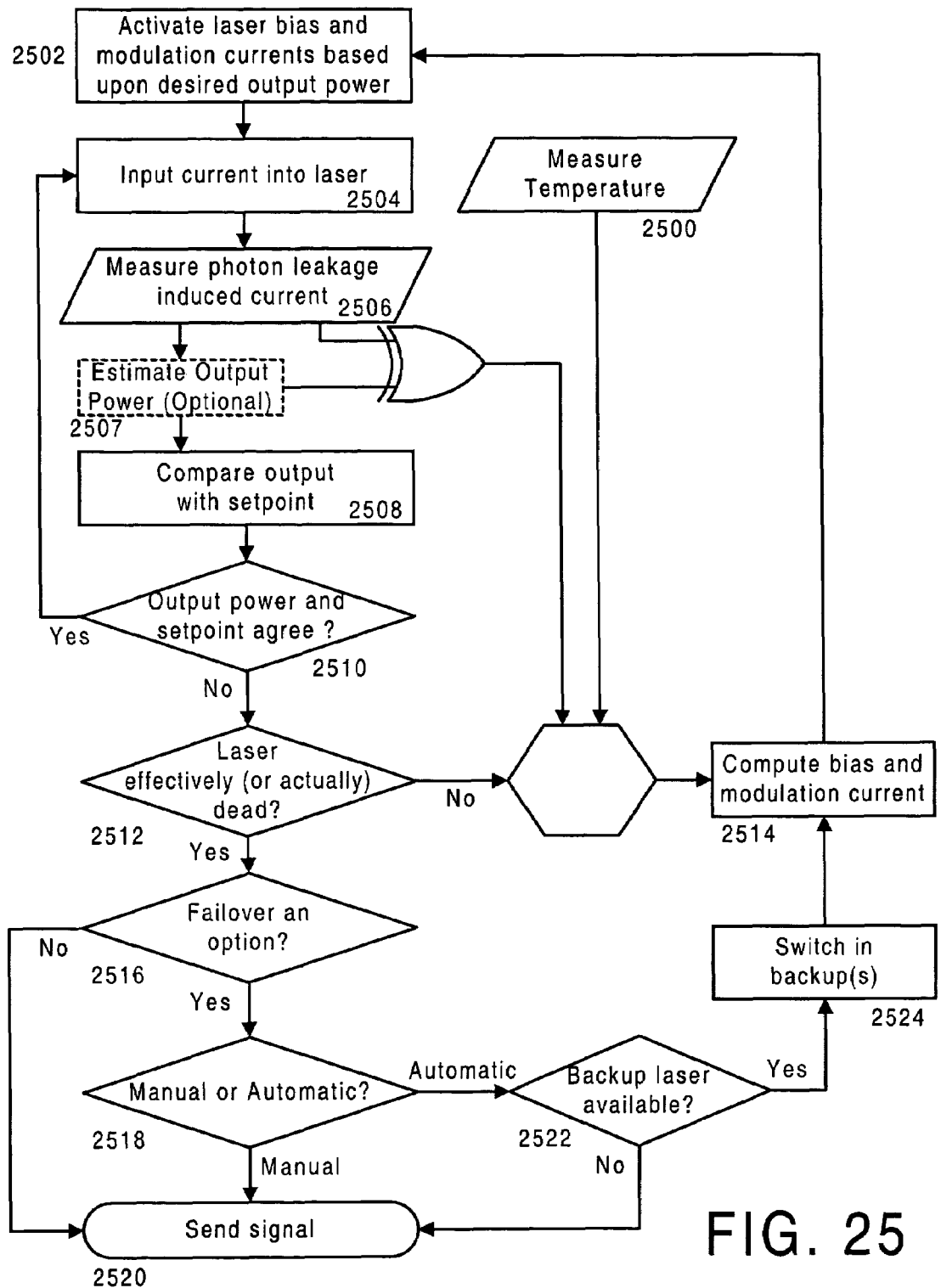
FIG. 25 is sample pertinent portion of a control algorithm in a system having one or more opto-electronic units as discussed herein.

A sample pertinent portion of a control algorithm, for some of the features described above, in a system having one or more opto-electronic units according to the present invention is shown in FIG. 25.

The initial laser bias and activation currents are set based upon the desired output power (on an individual device or aggregate basis) (Step 2502). Current is then input into each laser being used (Step 2504). The passive side photon leakage is measured (Step 2506) and, depending upon the implementation, either the laser output power is estimated based upon the proportional relationship between the leakage photons measured via the passive side collector and the output power (Optional Step 2507), or the passive side measured value is used directly as a surrogate for the output power. The measured or estimated power is then compared with a set-point (i.e. some reference or standard value or range) (Step 2508). If the output of a laser coincides with the reference or standard or is in range (Step 2510), the same input current is used (i.e. return to Step 2504). If not, the a decision is made (Step 2512) as to whether that laser is "effectively dead" (which, in the example shown, includes actually dead). If the laser is not effectively dead, the output and, if available, a temperature measurement (Step 2500) taken at some meaningful time (i.e. any reasonable time for the particular application before, during or after Steps 2506 through 2512) are used to compute a new bias and/or modulation current for the laser (Step 2514) and the process repeats (i.e. return to Step 2502).

If the laser is effectively dead, and if the system includes a fail-over feature, the fail-over process can be activated (Step 2516). If there is no fail-over option, a channel alert signal or interrupt is sent (Step 2520). If fail-over is available and if the system includes a choice between manual and automatic fail-over, that decision can be made, for example based upon particular settings or external intervention (Step 2518). If manual intervention is necessary for fail-over to occur, a signal, for example, a channel alert signal or interrupt can be sent (Step 2520). If automatic fail-over is used, the availability of backup lasers is determined (Step 2522). If no backup laser is available, an alert or interrupt signal is sent (Step 2520). If a backup laser is available, the backup laser is switched in (Step 2524), an initial bias and modulation current is set for the new laser (Step 2514) and the process repeats (i.e. return to Step 2502).

Having described a number of different embodiments and applications, it will be apparent that various permutations and combinations can be straightforwardly created and/or substituted, for example in the case of the flowchart of FIG. 25, aspects such as temperature measurement, and fail-over are optional, such that one or both can be omitted in particular implementations and other features that make use of the invention can be added or substituted.

It should be understood that the above description is only representative of illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A laser-based device comprising:
    a VCSEL-type laser having an active side and a passive side opposite the active side; and
    a photodetector unit on the passive side, the photodetector unit comprising
        an absorbing region located so as to receive leakage photons exiting the laser through the passive side, and
        a Schottky contact having a first portion abutting the absorbing region and through which a current, caused by absorption of the leakage photons in the absorbing, can be measured and a substrate located between a second portion of the Schottky contact and the absorbing region.

2. The device of claim 1 further comprising:
    a substrate abutting the active side.

3. The device of claim 2 wherein the substrate comprises:
    an access way over at least a portion of the active side so that, when the laser emits light through the active side, the emission will pass through the access way.

4. The device of claim 1 wherein the absorbing region comprises
    a substrate on which the laser was grown.

5. The device of claim 1 wherein the laser is a top emitting laser.

6. The device of claim 1 wherein the laser is a bottom emitting laser.

7. The device of one of claims 1-4 and 5-6 further comprising:
    an electronic circuit chip hybridized to the laser.

8. The device of claim 7 further comprising:
    a planarizing dielectric located between at least a portion of the electronic circuit chip and the laser.

9. The device of one of claims 1-4 and 5-6 wherein the active side comprises an active side mirror and wherein the active side mirror is doped so as to be p-type.

10. The device of one of claims 1-4 and 5-6 wherein the active side comprises an active side mirror and wherein the active side mirror is doped so as to be n-type.

11. The device of claim 1 wherein the absorbing region is a semi-insulating material.

12. The device of claim 11 wherein the semi-insulating material comprises:
    Gallium Arsenide.

13. The device of claim 11 wherein the semi-insulating material is less than two microns in thickness.

14. The device of claim 11 wherein the semi-insulating material is about 1 micron in thickness.

15. The device of one of claims 1-4 and 5-6 wherein the active side comprises an active side mirror and wherein the active side mirror comprises at least one of a carbon dopant, a berrilium dopant or a zinc dopant.

16. The device of claim 15 wherein the active side mirror comprises:
    AluminumGalliumArsenide.

17. The device of one of claims 1-4 and 5-6 wherein the passive side comprises a passive side mirror and wherein the passive side mirror comprises at least one of a silicon dopant or a tellurium dopant.

18. The device of claim 17 wherein the active side mirror comprises:
    AluminumGalliumArsenide.

* * * * *